United States Patent [19]
Kawasaki et al.

[11] Patent Number: 5,369,290
[45] Date of Patent: Nov. 29, 1994

[54] LIGHT EMISSION ELEMENT USING A POLYCRYSTALLINE SEMICONDUCTOR MATERIAL OF III-V GROUP COMPOUND

[75] Inventors: Hideshi Kawasaki, Yamato; Hiroyuki Tokunaga, Kawasaki, both of Japan

[73] Assignee: Canon Kabushiki Kaisha, Tokyo, Japan

[21] Appl. No.: 872,287

[22] Filed: Apr. 22, 1992

[30] Foreign Application Priority Data

Apr. 22, 1991 [JP] Japan .................................. 3-116523
Apr. 21, 1992 [JP] Japan .................................. 4-100778

[51] Int. Cl.$^5$ ...................... H01L 33/00; H01L 29/04
[52] U.S. Cl. .................................. 257/103; 257/64; 257/72; 257/79; 257/91; 257/99; 372/43
[58] Field of Search ............... 257/72, 64, 79, 91, 257/99, 103; 372/43

[56] References Cited

U.S. PATENT DOCUMENTS 5,010,033 4/1991 Tokunaga et al. .................... 437/83
5,036,373 7/1991 Yamazaki ............................ 257/103

FOREIGN PATENT DOCUMENTS 0284433 9/1988 European Pat. Off. .
0285358 10/1988 European Pat. Off. .
60-194581 10/1985 Japan ................................... 257/64
64723 1/1989 Japan .

OTHER PUBLICATIONS

J. P. Salerno et al., "Cathodoluminescence Analysis of Polycrystalline GaAs," *RECIEEE*, vol. 15, 1981, pp. 1174–1178.
O. Paz et al., "Collection of electron-beam-generated carriers in the presence of a grain boundary or an epitaxial interface," *Journal of Applied Physics*, vol. 61, No. 4, Feb. 15, 1987, pp. 1537–1546.
M. Yamaguchi et al., "Efficiency considerations for polycrystalline GaAs thin-film solar cells," *Journal of Applied Physics*, vol. 60, No. 1, Jul. 1, 1986, pp. 413–417.

*Primary Examiner*—Jerome Jackson
*Attorney, Agent, or Firm*—Fitzpatrick, Cella, Harper & Scinto

[57] ABSTRACT

A light emission element using a plycrystalline semiconductor material of III-V group compound comprises an n type semiconductor polycrystalline layer and a p type semiconductor polycrystalline layer. In such a light emission element, the n type semiconductor polycrystalline layer and the p type semiconductor polycrystalline layer comprise a light emitting area formed by polycrystals having the average grain size of 0.6 $\mu$m or more, and a wiring area formed by polycrystals having the average grain size of 0.5 $\mu$m or less. Hence, the light emission efficiency is enhanced as well as improving the reliability of the element.

2 Claims, 44 Drawing Sheets

PLAN VIEW

TOP VIEW

PLAN VIEW

TOP VIEW

SECTIONAL VIEW

TOP VIEW

PLAN VIEW

TOP VIEW

PLAN VIEW

TOP VIEW

PLAN VIEW

TOP VIEW

PLAN VIEW

TOP VIEW

PLAN VIEW

TOP VIEW

PLAN VIEW

TOP VIEW

SECTIONAL VIEW

TOP VIEW

PLAN VIEW

FIG. 41B PRESENT INVENTION

TOP VIEW

SECTIONAL VIEW

TOP VIEW

SECTIONAL VIEW

TOP VIEW

SECTIONAL VIEW

TOP VIEW

SECTIONAL VIEW

TOP VIEW

SECTIONAL VIEW

TOP VIEW

SECTIONAL VIEW

PRESENT INVENTION

LIGHT EMISSION ELEMENT USING A POLYCRYSTALLINE SEMICONDUCTOR MATERIAL OF III-V GROUP COMPOUND

BACKGROUND OF THE INVENTION

1. Field of the Invention

The present invention relates to a light emission element using a polycrystalline semiconductor material of III-V group compound and manufacturing method therefor.

2. Related Background Art

Traditionally, there have been applications of polycrystalline semiconductor material as given below.

(1) As to the polycrystalline semiconductor materials of IV group compound, Si polycrystal is applicable to solar cells and thin film transistors.

(2) As to the polycrystalline semiconductor materials of II-VI group compound, Cd polycrystal is applicable to thin film transistors and photosensors. Also, it is being applied to solar cells. Here, Zn polycrystal is applicable to EL (electroluminescence) elements, phosphores, piezoelectric elements, and the like. Further, chalcopyrite polycrystal such as $CuInSe_2$ is being applied to solar cells.

(3) As to the polycrystalline semiconductor materials of III-V group compound, Ga and In polycrystals are under study for its applications to solar cells. However, they have not been put into practice as yet. Also, there are many documents available as regards the solar cells using the polycrystalline semiconductor materials of III-V group compound, but the reports on the light emission characteristics are just a few. Also, while SALERNO JP et al. reported on the electron beam luminescence (see conf. RECIEEE vol. 15th pp. 1174–1178), there is no description of research on the characteristics of LED (light emitting diode) using PN junction.

In general, displays using light emission elements are structured in such a way that many light emission elements are formed on a monocrystalline wafer, and one or a plurality of light emission elements are cut off from the monocrystalline wafer for bonding the cut-off light emission element or elements to a supporting substrate. Accordingly, if a large-area LED display element should be formed, many LEDs are hybridized, leading to a high cost. Hence there is a disadvantage in that its use is rather limited.

Therefore, in order to release the restraint on the display area of LED display elements, the present inventor et al have proposed a selective nucleation method as a method for forming large area semiconductor monocrystals of III-V group compound (Japanese Patent Laid-Open Application No. 64-723). This method is such that a non-nucleation surface having a small nucleation density, and a nucleation surface having an area small enough to deposit crystals composed of only single nuclei and a nucleation density larger than that of the non-nucleation surface as well are arranged adjacently on a substrate having a free surface, and then monocrystals are deposited from the single nuclei by performing a crystal deposition treatment on this substrate.

Also, the present inventor et al have proposed a method disclosed in European Patent Laid-Open Application No. EP0285358A2.

According to the disclosure, this method is such that when the aforesaid mono-crystals are formed, PN junction area is produced by switching the crystal formation processing conditions to form LEDs on a non-monocrystalline substrate.

Further, the present inventor et al have proposed a selective semiconductor element formation method by polycrystals (Japanese Patent Laid-Open Application No. 2-303394).

FIGS. 49A through 49E are views showing the fabrication processes of a manufacturing method for a light emission element using polycrystalline semiconductor material of III-V group compound on the basis of the selective semiconductor formation method by polycrystals which has been proposed by the present inventor et al.

The general processes for this manufacturing method will be as given below.

a non-nucleation surface deposition process for depositing a non-nucleation surface 511 on a substrate 510 by a thermal oxidation treatment, deposition, sputtering, or the like, and a nucleation surface formation process (A) for forming a polycrystalline deposition nucleation surface 512 by removing the unwanted nucleation surface with a wet etching by acid, alkali, or some other solution or by a dry etching with a reaction beam etching (RIBE) or the like subsequent to deposition on the non-nucleation surface 511 by an E deposition, resistive thermal deposition, or sputtering the nucleation surface being composed of the non-monocrystalline substance of $Al_2O_3$, $Ta_2O_5$, a semiconductor polycrystalline layer formation process (B) for forming sequentially an n type semiconductor polycrystalline layer 515 composed of a polycrystalline semiconductor material of III-V group compound and a p type semiconductor polycrystalline layer 516 by utilizing the difference between the densities of the non-nucleation surface 511 and the polycrystalline deposition nucleation surface 512 by MOCVD (organometal chemical vapor deposition) method with the polycrystalline deposition nucleation surface 512 as its starting point;

a first electrode formation process (C) for forming the first electrode 517 on half the surface of the p type semiconductor polycrystalline layer 516 on the right-hand side from its center by a resistance thermal deposition method or electron beam thermal deposition method;

a semiconductor polycrystalline layer removal process (D) for removing half the p type semiconductor polycrystalline layer 516 on the left-hand side from its center, where no resist 518 is coated, by the wet etching or dry etching after the resist 518 has been coated on the surface of the first electrode 517, so that the surface of the n type semiconductor polycrystalline layer 515 on this portion is allowed to be exposed; and a second electrode formation process (E) for forming the second electrode 519 on the exposed surface of the n type semiconductor polycrystalline layer 515 in the same manner as in the case of the first electrode 517 formation.

However, as a result of experiments on the light emission elements fabricated by the above-mentioned selective semiconductor element formation method by polycrystals, it has been found that while the light emission efficiency becomes greater as the grain sizes of the polycrystals of the n type semiconductor polycrystalline layer 515 and p type semiconductor polycrystalline layer 516 become larger, the surface irregularities and the height of the crystal islands become greater, and that the wirings between the first and second electrodes 517 and 519 tend to be damaged. Also, it has been found that there may be some cases where the reliability is lowered due to the disconnection of the electrodes if the grain size of the polycrystals is made larger in order to make the light emission efficiency greater, hence leaving a room for improvements in this respect.

SUMMARY OF THE INVENTION

It is an object of the present invention to make a further improvement of the method for fabricating semiconductor elements which is disclosed in Japanese Patent Laid-Open Application No. 2-303394.

It is another object of the present invention to provide a light emission element using a polycrystalline semiconductor material of III-V group compound, whereby to make its light emission efficiency greater while implementing improvement in its reliability, and to provide the manufacturing method therefor.

BRIEF DESCRIPTION OF THE DRAWINGS

FIGS. 10A and 10B are schematic views showing the processes for the non-nucleation surface deposition and nucleation surface deposition wherein FIG. 10A is a plan view showing a light emission element while FIG. 10B is a cross-sectional view taken along the line 10B—10B in FIG. 10A.

FIGS. 11A and 11B are schematic views showing the process for a semiconductor polycrystalline layer formation in a method for manufacturing emission elements, wherein FIG. 11A is a plan view showing the emission element while FIG. 11B is a cross-sectional view taken along the line 11B—11B in FIG. 11A.

FIGS. 12A and 12B are schematic views showing the process for first electrode formation in the method for manufacturing light emission elements wherein FIG. 12A is a plan view showing a light emission element while FIG. 12B is a cross-sectional view taken along the line 12B—12B in FIG. 12A.

FIGS. 13A and 13B are schematic views showing the process for the polycrystalline layer removal in the method for manufacturing light emission elements wherein FIG. 13A is a plan view showing a light emission element while FIG. 13B is a cross-sectional view taken along the line 13B—13B in FIG. 13A.

FIGS. 14A and 14B are schematic views showing the process for a second electrode formation in the method for manufacturing light emission elements wherein FIG. 14A is a plan view showing a light emission element while FIG. 14B is a cross-sectional view taken along the line 14B—14B in FIG. 14A.

FIGS. 15A and 15B are schematic views showing an example of the processes for non-nucleation surface deposition and nucleation surface deposition in the method for manufacturing method for light emission elements according to the present invention, wherein FIG. 15A is a plan view showing a light emission element while FIG. 15B is a cross-sectional view taken along the line 15B—15B in FIG. 15A.

FIGS. 16A and 16B are schematic views showing an example of the process for the semiconductor polycrystalline layer formation in the method for manufacturing light emission elements according to the present invention, wherein FIG. 16A is a plan view showing a light emission element while FIG. 16B is a cross-sectional view taken along the line 16B—16B in FIG. 16A.

FIGS. 17A and 17B are schematic views showing an example of the process for the first electrode formation in the method for manufacturing light emission elements according to the present invention, wherein FIG. 17A is a view showing a light emission element while FIG. 17B is a cross-sectional view taken along the line 17B—17B in FIG. 17A.

FIGS. 18A and 18B are schematic views showing an example of the process for the polycrystalline layer removal in the method for manufacturing light emission elements according to the present invention, wherein FIG. 18A is view showing a light emission element while FIG. 18B is a cross-sectional view taken along the line 18B—18B in FIG. 18A.

FIGS. 19A and 19B are schematic views showing an example of the process for the second electrode formation in the method for manufacturing light emission elements according to the present invention, wherein FIG. 19A is a view showing a light emission element while FIG. 19B is a cross-sectional view taken along the line 19B—19B in FIG. 19A.

FIGS. 20A and 20B are schematic views showing an example of a method for forming the large grain polycrystalline deposition surface in the process for the nucleation surface formation in the method for manufacturing light emission elements according to the present invention, wherein FIG. 20A is a plan view showing a light emission element while FIG. 20B is a cross-sectional view taken along the line 20B—20B in FIG. 20A.

FIGS. 21A and 21B are schematic views showing an example of a method for forming the first and second small grain polycrystalline deposition nucleation surfaces in the process for the nucleation surface formation in the method for manufacturing light emission elements according to the present invention, wherein FIG. 21A is a plan view showing a light emission element while FIG. 21B is a cross-sectional view taken along the line 21B—21B in FIG. 21A.

FIGS. 22A and 22B are schematic views showing an example of the process for forming a semiconductor polycrystalline layer in the method for manufacturing light emission element according to the present invention, wherein FIG. 22A is a plan view showing a light emission element while FIG. 22B is a cross-sectional view taken along the line 22B—22B in FIG. 22A.

FIGS. 23A and 23B are schematic views showing an example of the process for forming the first electrode in the method for manufacturing light emission elements according to the present invention, wherein FIG. 23A is a plan view showing a light emission element while FIG. 23B is a cross-sectional view taken along the line 23B—23B in FIG. 23A.

FIGS. 24A and 24B are schematic views showing an example of the process for the semiconductor polycrystalline layer removal in the method for manufacturing light emission elements according to the present invention, wherein FIG. 24A is a plan view showing a light emission element while FIG. 24B is a cross-sectional view taken along the line 24B—24B in FIG. 24A.

FIGS. 25A and 25B are schematic views showing an example of the process for the second electrode formation in the method for manufacturing light emission elements according to the present invention, wherein FIG. 25A is a plan view showing a light emission element while FIG. 25B is a cross-sectional view taken along the line 25B—25B in FIG. 25A.

FIGS. 26A and 26B are schematic views illustrating another example of the method for a polycrystalline deposition nucleation surface formation with an n type semiconductor polycrystalline layer and p type semiconductor polycrystalline layer as its deposition starting point, wherein FIG. 26A is a plan view showing a light emission element while FIG. 26B is a cross-sectional view taken along the line 26B—26B in FIG. 26A.

FIGS. 41A and 41B are graphs showing the distribution of the optical output of an LED according to an example of the prior art and the distribution of the optical output of an LED according to the present invention.

FIGS. 49A to 49E are views showing the processes for the method for manufacturing light emission elements on the basis of the selective semiconductor element formation method by polycrystals proposed by the present inventor et al. wherein FIG. 49A is a view showing the process for non-nucleation surface deposition, FIG. 49B is a view showing the process for semiconductor polycrystalline layer formation, FIG. 49C is a view showing the 10 process for the first electrode formation, FIG. 49D is a view showing the process for the semiconductor polycrystalline layer removal, and FIG. 49E is a view showing the process for the second electrode formation.

DETAILED DESCRIPTION OF THE PREFERRED EMBODIMENTS

Figure 1:
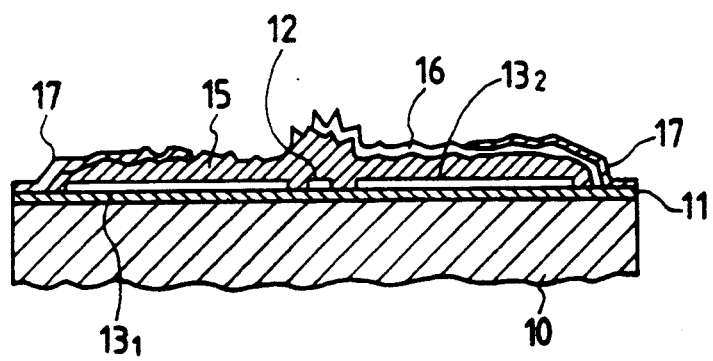
FIG. 1 is a cross-sectional view showing an example of a light emission element using a polycrystalline material of III-V group compound according to the present invention.

Hereinafter, in reference to the accompanying drawings, the detailed description will be made of the embodiments according to the present invention.

A first embodiment of a light emission element using a polycrystalline semiconductor material of III-V group compound according to the present invention will be as given below. In other words, in a light emission element using a polycrystalline semiconductor material of III-V group compound including an n type semiconductor polycrystalline layer and p type semiconductor polycrystalline layer, the first embodiment is characterized in that the aforesaid n type semiconductor polycrystalline layer and the aforesaid p type semiconductor polycrystalline layer are provided with a light emitting area formed by polycrystals of the average grain size of 0.6 $\mu$m or more and a wiring area formed by polycrystals of the average grain size of 0.5 $\mu$m or less.

A second embodiment of a light emission element according to the present invention will be as given below. In other words, a light emission element is structured with polycrystals of III-V group compound formed by a crystal formation treatment on a substrate having a first nucleation surface which becomes the starting point of a PN junction to form a non-nucleation surface with small nucleation density and a light emitting area with nucleation density larger than the aforesaid non-nucleation surface, and a second nucleation surface which becomes the starting point of a junction for the p type semiconductor layer and n type semiconductor layer on which take off electrodes are formed, the second embodiment is characterized in that the positions of the second nucleation surface which becomes the starting point for the aforesaid p type semiconductor layer and the aforesaid first nucleation surface against the second nucleation surface, which becomes the starting point for the aforesaid n type semiconductor layer, are arranged asymmetrically, and the average grain size of the polycrystalline semiconductor constituting the light emitting area is 0.6 $\mu$m or more while the average grain size of the p type semiconductor layer and n type semiconductor layer, on which the aforesaid take off electrodes are formed, is 0.5 $\mu$m or less.

A preferred embodiment of a method for manufacturing a light emission element according to the present invention will be given below. A method for manufacturing a light emission element using a polycrystalline semiconductor material of III-V group compound including n type semiconductor polycrystal layer and p type semiconductor polycrystal layer, is characterized by including the processes of:

forming a large grain polycrystalline deposition nucleation surface which becomes the starting point for the deposition of the polycrystals having the average grain size of 0.6 $\mu$m or more and a small grain polycrystalline deposition nucleation surface which becomes the starting point for the deposition of the polycrystals having the average grain size of 0.5 $\mu$m or less, and forming semiconductor polycrystalline layers by forming either one of the aforesaid n type semiconductor polycrystalline layer and p type semiconductor polycrystalline layer with the aforesaid large grain polycrystalline deposition nucleation surface and the aforesaid small grain polycrystalline deposition nucleation surface as the starting point thereof, and the other one of them subsequent thereto.

According to the present invention, it is possible to improve the light emission efficiency as well as to prevent the reduction of the reliability resulting from the disconnection of the electrodes by defining the average grain size of the polycrystals in the light emitting area to be 0.6 $\mu$m or more and the average grain size of the polycrystals in the wiring area to be 0.5 $\mu$m or less on the n type semiconductor polycrystalline layer and p type semiconductor polycrystalline layer.

Also, according to the present invention, it is possible to prevent short circuit and the property degradation of the PN junction due to the diffusion of the electrode material with the resultant improvement of the uniformity of the light emission intensity. Hence easier correction of the light emission intensities between the elements is easier to correct when a device is fabricated with many light emission elements being integrated therein.

EMBODIMENTS

Now, the description will be made of the various characteristics that the present inventor et al. have noted from experiments on the light emission elements using a polycrystalline semiconductor material of III-V group compound.

Figure 2:
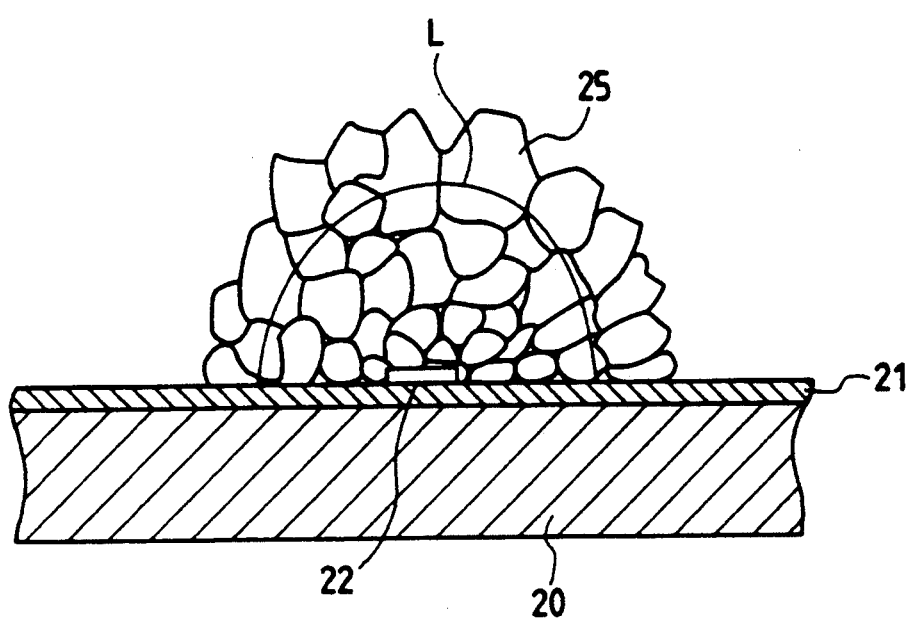
FIG. 2 is a cross-sectional view showing a specimen produced for investigating the relationship between the size of a polycrystalline deposition nucleation surface and the average grain size of the polycrystals.

Initially, a specimen is prepared for investigating the relationship between the size of the polycrystalline deposition nucleation surface and the average grain size of the polycrystals in such a manner that as shown in FIG. 2, on an Si substrate 20, an SiO$_2$ film 21 (non-nucleation surface) is deposited to form a square polycrystalline deposition nucleation surface 22 made of polysilicon on the SiO$_2$ film 21, and by using an MOCVD method a GaAs polycrystalline layer 25, which is a polycrystalline semiconductor material of III-V group compound, is selectively deposited with the polycrystalline deposition nucleation surface 22 as its starting point. In Table 1, the deposition conditions for the GaAs polycrystalline layer 25 by the MOCVD method are shown.

TABLE 1

| Item | Deposition Conditions | |
|---|---|---|
| | Deposition Conditions | |
| III group material gas | TMG 2.4 × 10$^{-7}$ mol/min | |
| V group material gas | AsH$_3$ 1.4 × 10$^{-5}$ mol/min | |
| Etching gas | HCl 2.2 × 10$^{-7}$ mol/min | |
| Carrier gas | H$_2$ 10 l/min | |
| Substrate temperature | 775° C. | |
| Pressure | 20 Torr | |
| Deposition time | 60 min | |

Figure 3:
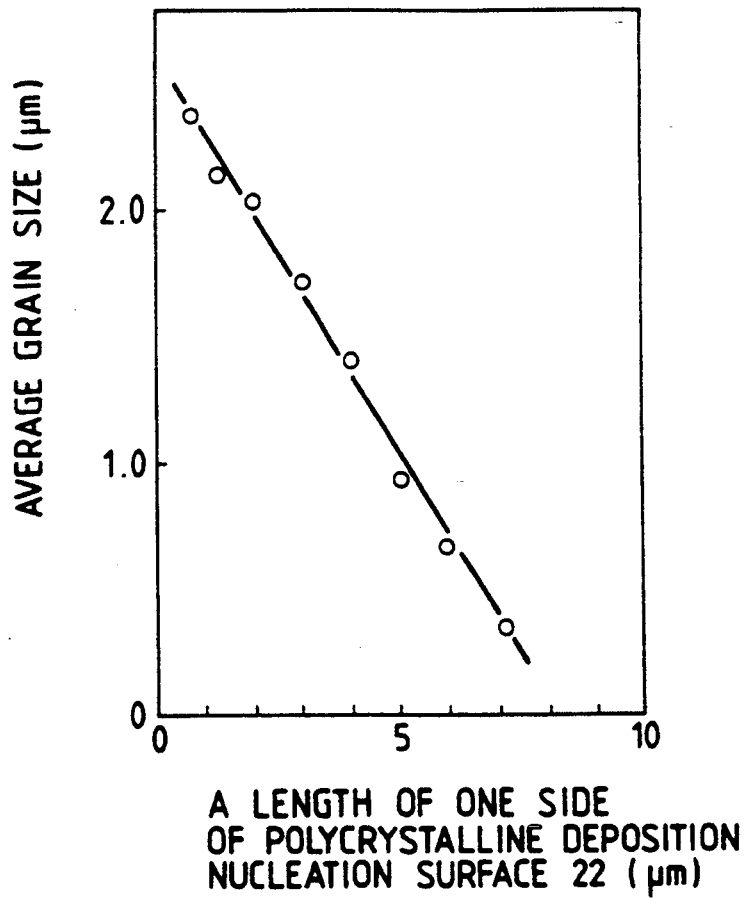
FIG. 3 is a graph showing the relationship between the size of the polycrystalline deposition nucleation surface and the average grain size of GaAs polycrystals.

The average grain size of the GaAs polycrystalline layer 25 produced is obtained by a method given below. Subsequent to the protection with epoxy resin (not shown) provided for the surface of the GaAs polycrystalline layer 25 shaped like an island after the selective deposition shown in FIG. 2, the Si substrate 21 is polished until its thickness becomes approximately 60 $\mu$m by the use of diamond paste. Then, the Si substrate 21 is further grinded by ion milling until its thickness becomes approximately 20 $\mu$m. After that, by the TEM observation (observation using a transmission electron microscope), a curve line L is drawn to connect points at a depth of approximately 2 μm from the surface of the GaAs polycrystalline layer 25, and the length of curved line L (23 μm in the example shown in FIG. 2) is divided by a number obtainable by adding one to the number of the crystal grains (10 in the example shown in FIG. 2) which intersect the curved line L to arrive at the average grain size (approximately 2.1 μm in the example shown in FIG. 2) of the GaAs polycrystalline layer 25. However, the small grain having the size less than 10% of the size of the largest grain is completely removed. FIG. 3 is the result of one experiment in which the relationship between the average grain size of the GaAs polycrystalline layer 25 and the size of the polycrystalline deposition nucleation surface 22 is measured. From this result, it is noted that the size of the polycrystalline deposition nucleation surface 22 and the average grain size of the GaAs polycrystalline layer 25 are substantially in inverse proportion to each other.

In this respect, it has been found by TEM observation that in the area in the vicinity approximately 2 to 3 μm from the polycrystalline deposition nucleation surface 22, the grain sizes of the GaAs polycrystalline layer 25 are slightly small and in the outside thereof, the grain sizes of the GaAs polycrystalline layer 25 are almost even in that they have the same value.

Figure 4:
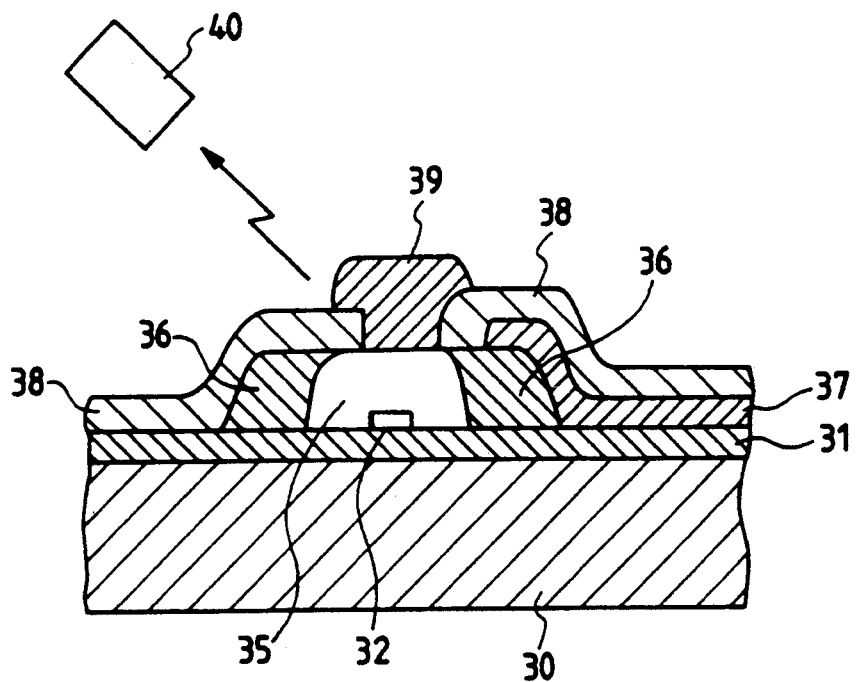
FIG. 4 is a cross-sectional view showing a light emitting diode produced for investigating the relationship between the size of the polycrystalline deposition nucleation surface and light emission characteristics.

Subsequently, in order to investigate the relationship between the size of the polycrystalline deposition nucleation surface and the light emission characteristics, a vertically structured light emitting diode is produced as shown in FIG. 4. This light emitting diode comprises an Si substrate 30, an SiO$_2$ film 31 deposited on the Si substrate 30, a polysilicon polycrystalline deposition nucleation surface 32 formed on the SiO$_2$ film 31, a p type GaAs polycrystalline layer 35 and n type GaAs polycrystalline layer 36 flattened after being deposited sequentially by an MOCVD method with the polycrystalline deposition nucleation surface as its starting point, an AuGe/Au electrode 37 connected to the n type GaAs polycrystalline layer 36 and Cr/Au electrode 39 connected to the p type GaAs polycrystalline layer 35, and an insulating film 38 for insulating the AuGe/Au electrode 37 and Cr/Au electrode 39. In Table 2, deposition conditions for the p type GaAs polycrystalline layer 35 and n type GaAs polycrystalline layer 36 by the MOCVD method are shown.

TABLE 2

| Item | Deposition Conditions |
|---|---|
| III group material gas | TMG 3.0 × 10$^{-7}$ mol/min |
| V group material gas | AsH$_3$ 2.0 × 10$^{-5}$ mol/min |
| Etching gas | HCl 2.2 × 10$^{-7}$ mol/min |
| Carrier gas | H$_2$ 10 l/min |
| Doping gas | DEZn 6.0 × 10$^{-8}$ mol/min (p type) SiH$_4$ 5.0 × 10$^{-8}$ mol/min (n type) |
| Substrate temperature | 775° C. |
| Pressure | 20 Torr |
| Deposition time | 60 min |

Figure 5:
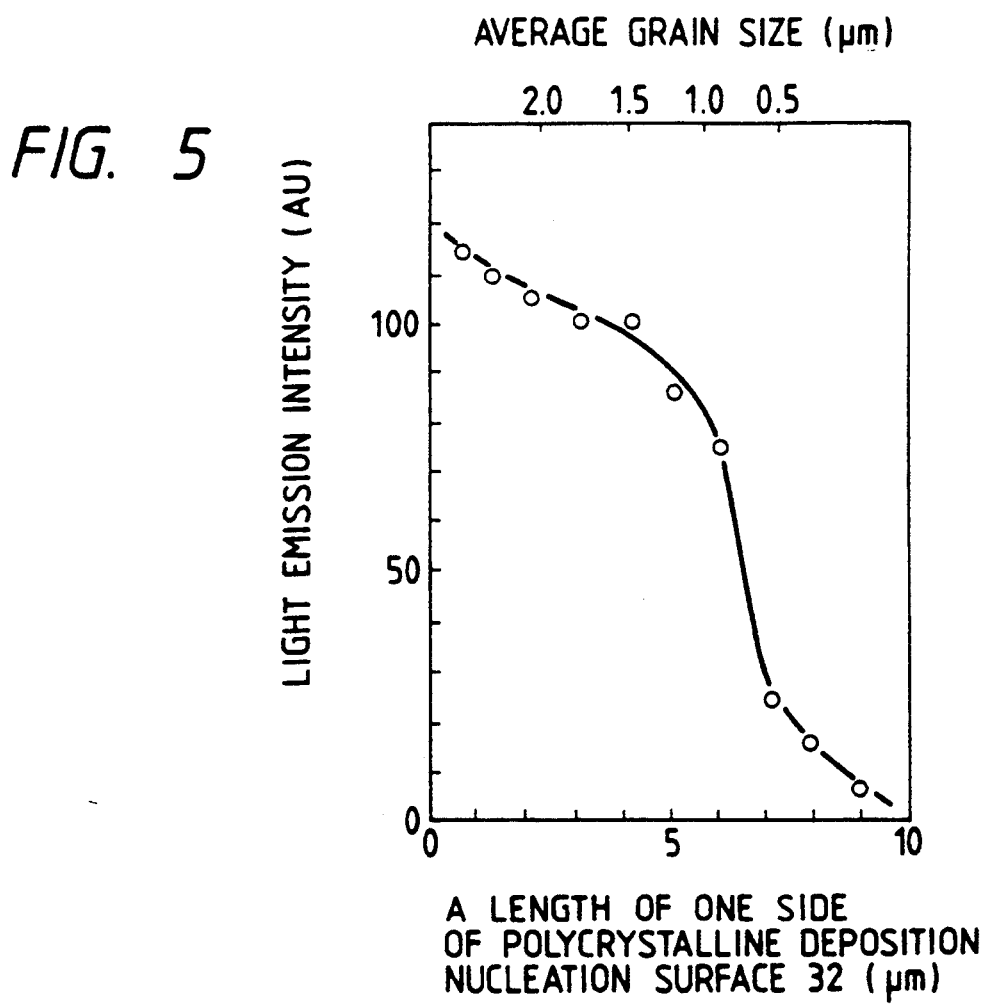
FIG. 5 is a graph showing the relationship between the size of the polycrystalline deposition nucleation surface and the average grain size and light emission intensity of the p type GaAs polycrystalline layer and GaAs polycrystalline layer.

The intensity of the light being emitted from the junction plane of the p type GaAs polycrystalline layer 35 and n type GaAs polycrystalline layer 36 of this light emitting diode is measured by a light power meter 40, the relationship between the light emission intensity, the average grain sizes of the p type GaAs polycrystalline layer 35 and n type GaAs polycrystalline layer 36, and the size of the polycrystalline deposition nucleation surface 32 is measured. The results of the experiments are shown in FIG. 5. For the average grain size in this respect, the values obtainable by the TEM observation described earlier at a depth approximately 2 μm from the p type GaAs polycrystalline layer 35 are adopted. The reason therefor is that the light emission from the light emitting diode is substantially generated at such position, making it possible to grasp remarkably the influences given by the grain sizes to the light emission intensity by observing the values obtainable therefrom. From the results of the experiments shown in FIG. 5, it has been found that the greater the average grain size is (that is, the smaller the polycrystalline deposition nucleation surface 32 is), the greater is the light emission intensity, and that the light emission intensity changes substantially with the average grain sizes approximately 0.6 to 0.8 μm. This is conceivably due to the increasing number of the non-light emission recombination in the crystal grain boundary which increases as the grain sizes of the polycrystals become smaller. In this respect, the recombination velocity of the carriers and the diffusion length of the minority carriers in the GaAs polycrystals were investigated. Then, the same tendency is obtained as in the case of (O. Paz et al., Appl. Phys., 61 (4) 15, p. 1537, 1987, and M. Yamaguchi et al., J. Appl. Phys., 60 (1) 1, p. 413, 1986). Also, the light emitting diode has its peak wavelength in the vicinity of 880 nm, not depending on the grain sizes of the p type GaAs polycrystalline layer 35 and n type GaAs polycrystalline layer 36.

Figure 6:
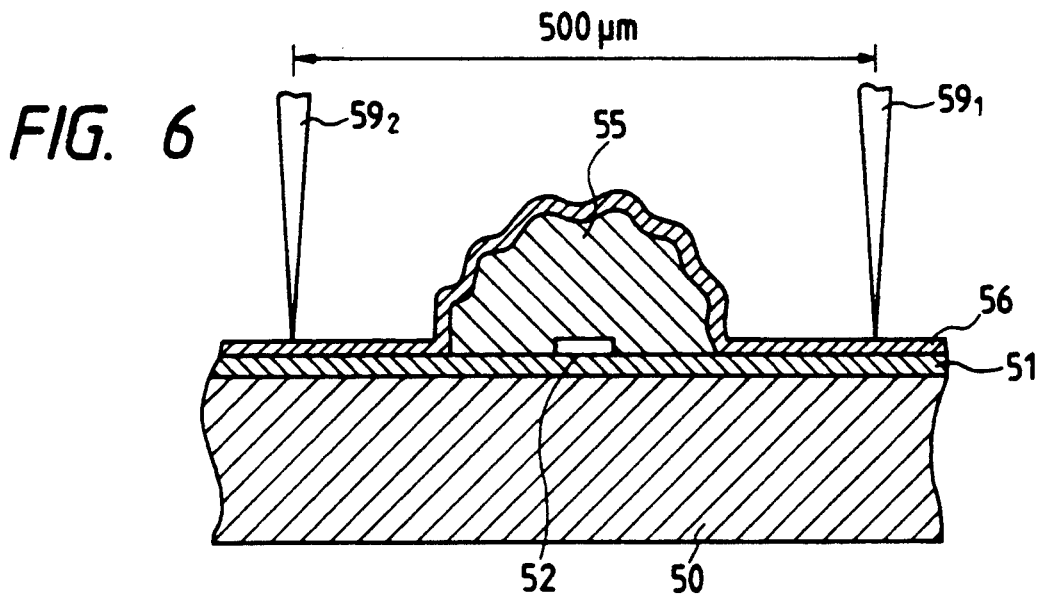
FIG. 6 is a cross-sectional view showing a specimen produced for investigating the relationship between the size of the polycrystalline deposition nucleation surface and the electrical resistances and disconnection probability of the electrodes.

Subsequently, in order to investigate the relationship between the size of the polycrystalline deposition nucleation surface and the electrical resistance and disconnection probability of the electrodes, a specimen with the Au electrode 56 having a film of 0.5 μm thick and 10 μm wide as shown in FIG. 6 formed in such a manner that a SiO$_2$ film 51 (non-nucleation surface) is deposited on a Si substrate 50, and a square polysilicon polycrystalline deposition nucleation surface 52 is formed on the SiO$_2$ film 51, and then a GaAs polycrystalline layer 55 is selectively deposited by the MOCVD method with the polycrystalline deposition nucleation surface 52 as its starting point to allow it to intersect the GaAs polycrystalline layer 55. In Table 3, the deposition conditions for the GaAs polycrystalline layer 55 by the MOCVD method are shown.

TABLE 3

| Item | Deposition Conditions |
|---|---|
| III group material gas | TMG 3.0 × 10$^{-7}$ mol/min |
| V group material gas | AsH$_3$ 1.4 × 10$^{-5}$ mol/min |
| Etching gas | HCl 2.2 × 10$^{-7}$ mol/min |
| Carrier gas | H$_2$ 10 l/min |
| Substrate temperature | 775° C. |
| Pressure | 20 Torr |
| Deposition time | 80 min |

Figure 7:
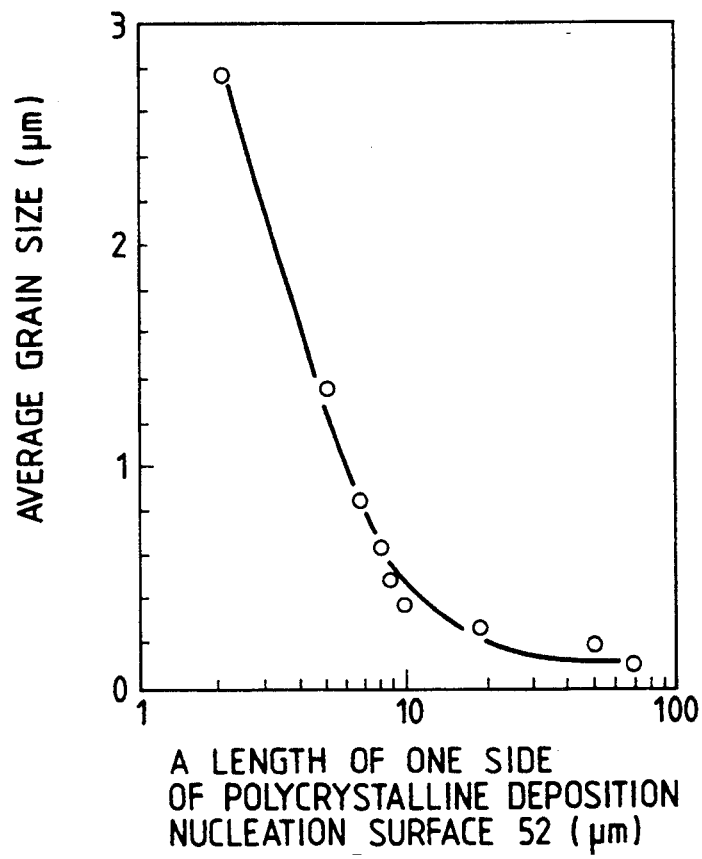
FIG. 7 is a graph showing the relationship between the average grain size of GaAs polycrystalline layer and the size of the polycrystalline deposition nucleation surface.
Figure 8:
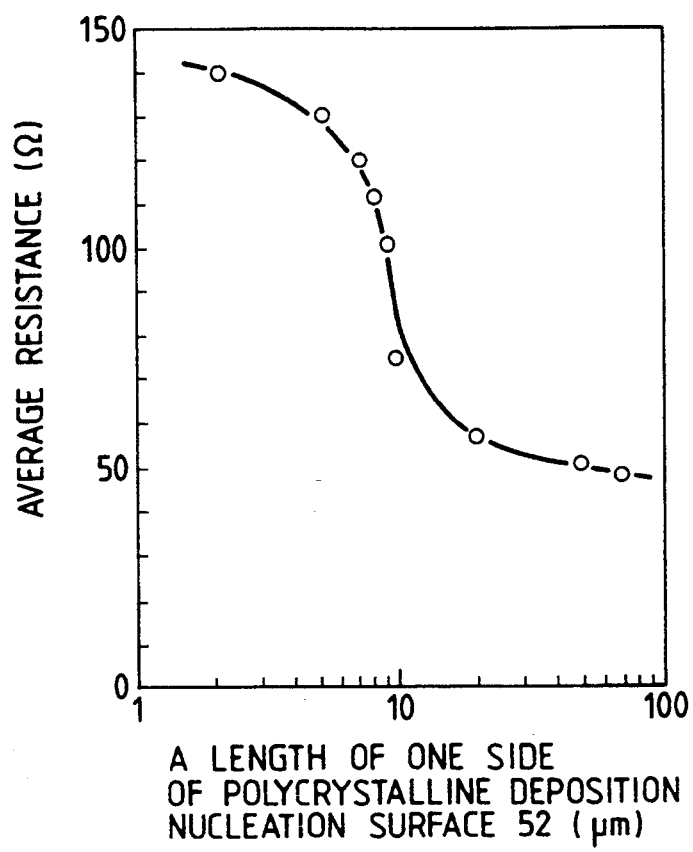
FIG. 8 is a graph showing the relationship between the average electrical resistance of the Au electrode and the size of the polycrystalline deposition nucleation surface.
Figure 9:
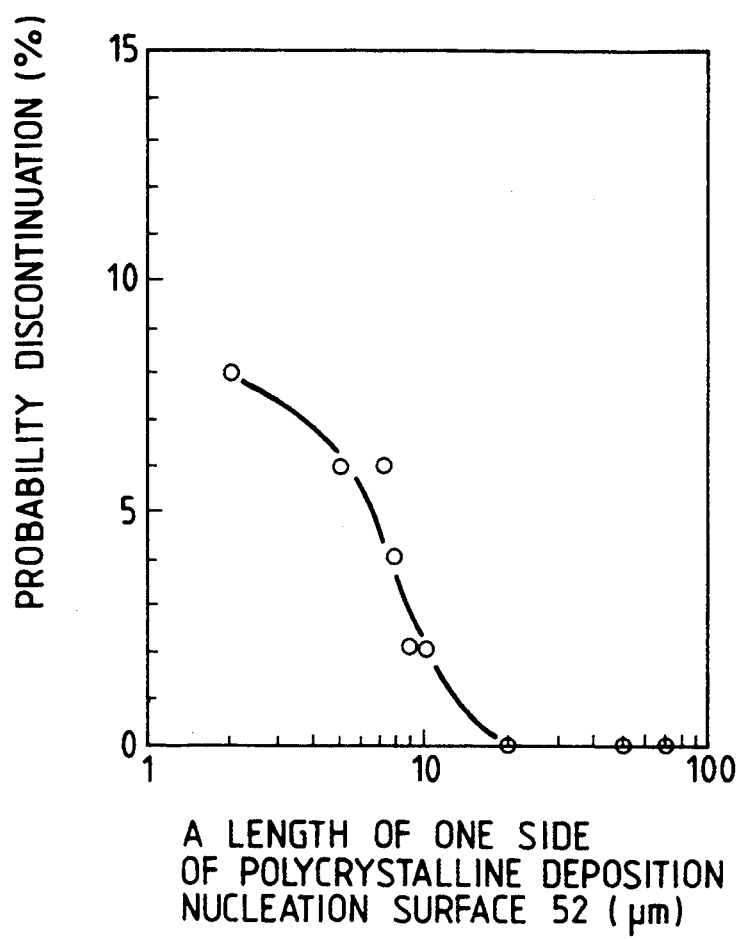
FIG. 9 is a graph showing the relationship between the disconnection probability of the Au electrode and the size of the polycrystalline position nucleation surface.

The relationship between the average grain size of the GaAs polycrystalline layer 55 and the size of the polycrystalline deposition nucleation surface 52 was measured for 50 specimens in the same method as in the aforesaid (1). The results of the experiments are shown in FIG. 7. Also, the results of one experimental measurement of the relationship between the average electrical resistance of the Au electrode 56 and the size of the polycrystalline deposition nucleation surface 52 are shown in FIG. 8. Further, the experimental results of the measurement of the relationship between the disconnection probability of the Au electrode 56 and the size of the polycrystalline deposition nucleation surface 52 are shown in FIG. 9. In this respect, the electrical resistances of the Au electrode 56 are obtained by causing probe needles 591 and 592 to be in contact with the Au electrodes 56 arranged 500 μm apart from each other with the polycrystalline deposition nucleation surface as its center to measure the electrical resistance between the Au electrodes 56 thus positioned. From the experimental results shown in FIG. 7, it has been found that when the length of one side of the polycrystalline deposition nucleation surface 52 is 10 μm or less, the average grain size of the GaAs polycrystalline layer 55 is in inverse proportion to the size of the polycrystalline deposition nucleation surface 52 as in the case of the experimental results shown in FIG. 3. From the experimental results shown in FIG. 8 and FIG. 9, it is noted that the longer the length of one side of the polycrystalline deposition nucleation surface 52 is (the smaller the average grain size of the GaAs polycrystalline layer 55 is), the smaller are the average electrical resistance and the disconnection probability of the Au electrode 56, and that the average electrical resistance of the Au electrode 56 changes abruptly with the length of one side of the polycrystalline deposition nucleation surface 52 being approximately 8 μm (the average grain size of the GaAs polycrystalline layer 55 being 0.5 μm) or less.

From the experimental results set forth above, in order to obtain a greater light emission efficiency it is better to deposit the polycrystalline layer of a lager grain size (preferably, the polycrystalline layer of 0.6 μm or more) when a light emission element is produced using a polycrystalline semiconductor material of III-V group compound. On the other hand, it has been confirmed that the polycrystalline layer having a smaller grain size (preferably, the polycrystalline layer of 0.5 μm or less) should be deposited for obtaining a smaller electrical resistance and disconnection probability. Therefore, it is possible for the light emission element which is a first embodiment according to the present invention as shown in FIG. 1 to enhance the light emission efficiency and at the same time, to improve the reliability against any possible disconnection of the first and second electrodes 17 and 19 because its n type semiconductor polycrystalline layer 15 and p type semiconductor polycrystalline layer 16 are provided with the light emission area formed by the polycrystals of the average grain size of 0.6 μm or more and the wiring area formed by the polycrystals of the average grain size of 0.5 μm or less.

Figure 50:
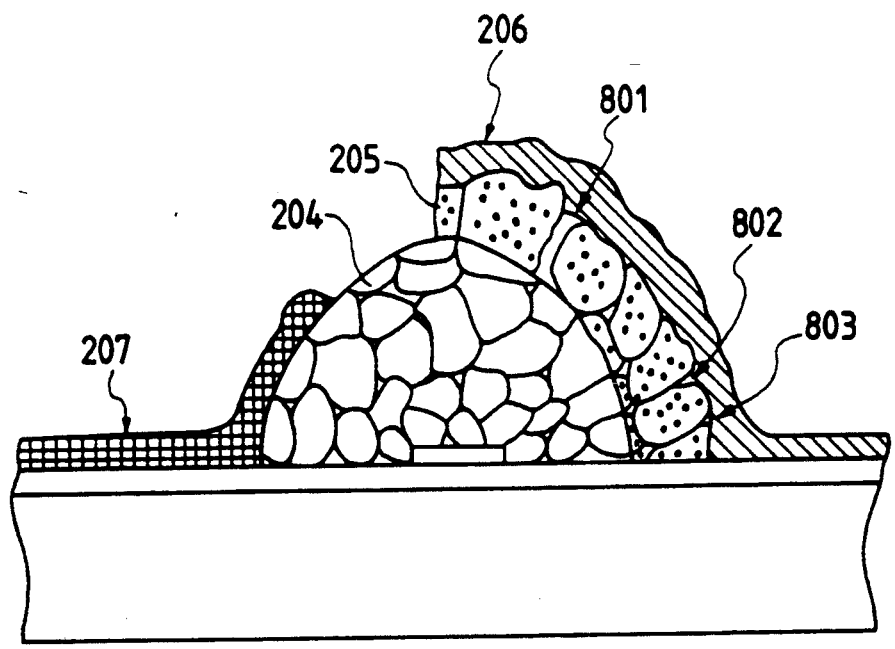
FIG. 50 is a schematic view showing the structure of a light emission element using III-V group component according to the prior art.

Subsequently, the description will be made of another embodiment according to the present invention on the basis of the knowledge obtained after further detailed studies on a method for manufacturing light emission elements proposed by the present inventor et al as shown in FIGS. 49A to 49E. Using the method shown in FIGS. 49A to 49E light emission elements are produced under certain conditions, and when the light emission intensities of completed LED elements are measured, it was found that there are included several percent of those the light intensity of which does not even attain 50% of the average value of the total elements. Therefore, after hardening the specimens having extremely the small light intensity with epoxy resin, they are polished in the direction perpendicular to the substrate for observations of their cross-section by a scanning type electron microscope (SEM). FIG. 50 is a cross-sectional view schematically showing the specimen thus prepared.

In the portions of the GaAs polycrystals having the small grain size, which are pinched between those having larger grain size, the portions, in which the metal of the electrode has conceivably been diffused, are found at 801 to 803 in FIG. 50. Particularly, the portion at 801 appears to have penetrated through the p type GaAs layer to the n type GaAs layer. A phenomenon such as this is not observed in the specimens having a strong light intensity.

Figure 31A:
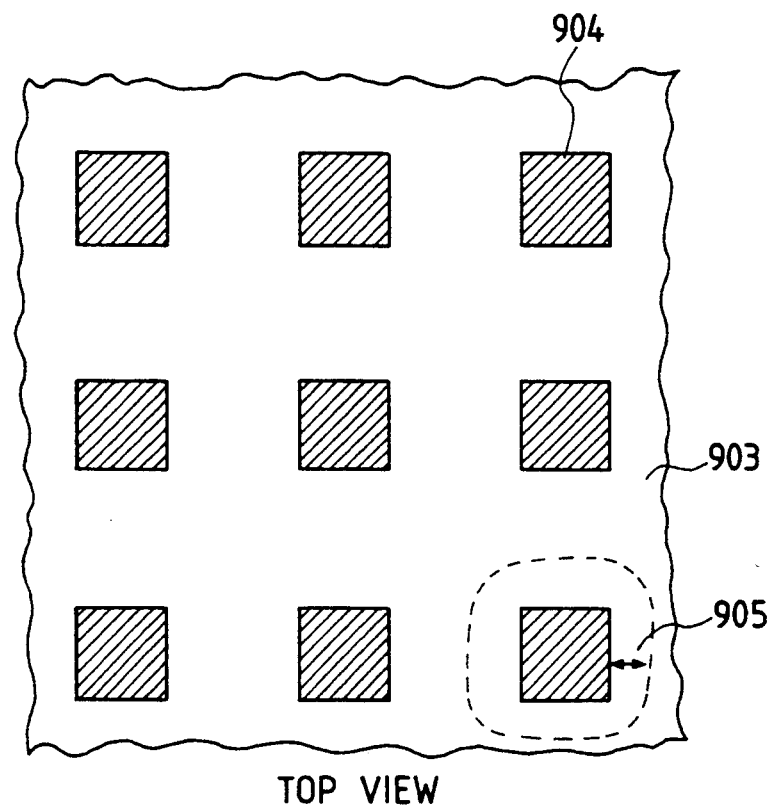
FIGS. 31A and 31B are schematic views showing a specimen for evaluating the diffusion of the electrode material into a polycrystal GaAs.
Figure 31B:
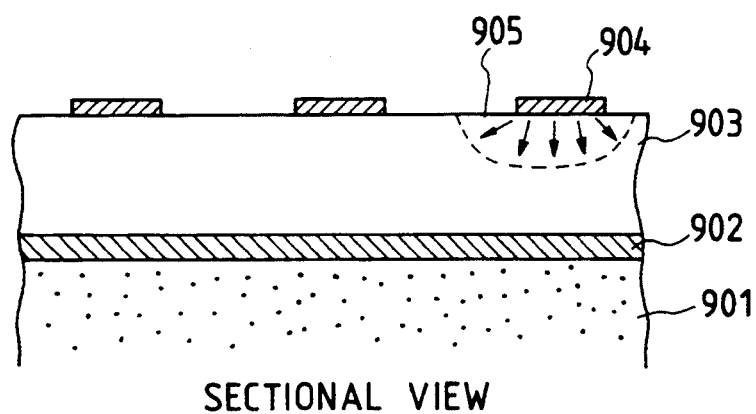

In order to confirm the aforesaid phenomenon, a specimen as shown in FIGS. 31A and 31B is produced to measure the distances of the diffused electrode material in the GaAs polycrystals by changing annealing temperatures.

The specimen is produced by depositing a polysilicon film 902 on an alumina substrate 901 for 500 Å and then a GaAs film 903 by the MOCVD method for 3 μm under the following conditions:

| | |
|---|---|
| TMG | $2.4 \times 10^{-5}$ mol/min |
| AsH$_3$ | $1.8 \times 10^{-3}$ mol/min |
| HCl (etching gas) | $1 \times 10^{-5}$ mol/min |
| H$_2$ (carrier gas) | 10 mol/min |
| Substrate temperature | 775° C. |
| Pressure | 30 Torr |
| Growth time | 120 min |

The polycrystal GaAs at this time is a fine granular film having the average crystalline grain size of approximately 0.2 μm.

After that, subsequent to having formed 10 a pattern with resist, a Cr/Au film is deposited. The deposition method employed therefor is to form a square pattern 904 with its one side being 100 μm long using a lift-off method after having continuously deposited the Cr 500 Å and Au 5,000 Å by a resistive thermal method. The space between each of the patterns is 120 μm.

This specimen is annealed in an electric oven, then and by changing the temperatures to diffuse metals. Hence, measuring its distance 905 from the above using an SEM.

The annealing conditions are: air pressure, argon atmosphere, and 10-minute annealing.

Figure 32:
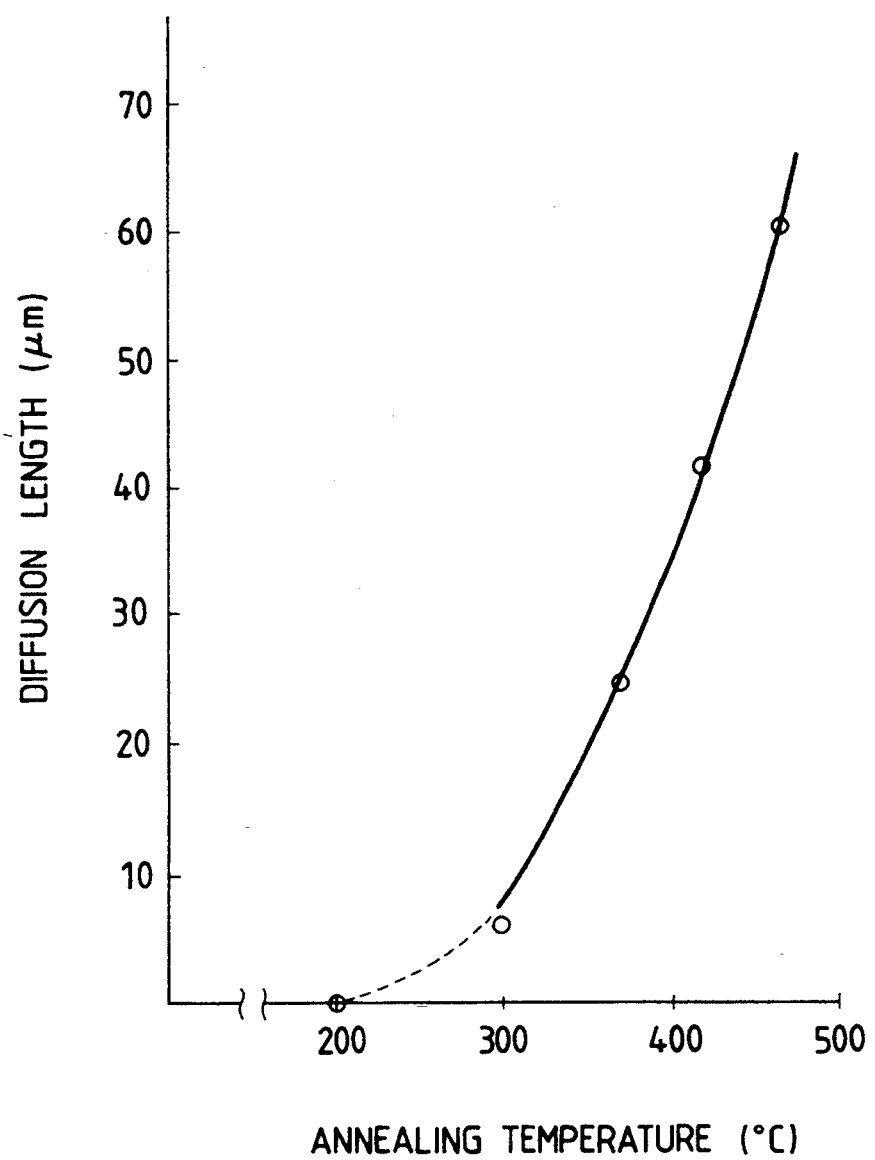
FIG. 32 is a graph showing the relationship between the annealing temperatures and diffusion distances.

FIG. 32 is a view showing the relationship between the annealing temperatures and the distances of the diffusion. It was found that in GaAs polycrystals of a small grain size such as employed this time, metals can inevitably be diffused for a considerable distance when a thermal treatment required for the ohmic junction is given.

Also, a specimen with electrodes of the same structure being bonded is produced on a GaAs epitaxial film for a thermal diffusion experiment under the same conditions. However, no conspicuous diffusion is observed.

From the results set forth above, there are conceivably two methods for the LED formation with a good yield by utilizing selectively deposited polycrystals.

(1) A structure is arranged so as to prevent the electrode material from being diffused to penetrate the PN junction.

(2) A crystal island is formed only with polycrystals of a large grain size so that metals can hardly be diffused.

A light emission element according to a second embodiment of the present invention, which is obtained to satisfy the aforesaid (1) and (2), will be as given below.

in other words, in a light emission element structured with polycrystals of III-V group compound formed by a crystal formation treatment on a substrate having a first nucleation surface which becomes the starting point of a PN junction to form a non-nucleation surface with small nucleation density and a light emitting area with nucleation density larger than the aforesaid non-nucleation surface, and a second nucleation surface which becomes the starting point of a junction for the p type semiconductor layer and n type semiconductor layer on which take off electrodes are formed, the second embodiment is characterized in that the positions of the second nucleation surface which becomes the starting point for the aforesaid p type semiconductor layer and the aforesaid first nucleation surface against the second nucleation surface, which becomes the starting point for the aforesaid n type semiconductor layer, are arranged asymmetrically, and the average grain size of the polycrystalline semiconductor constituting the light emitting area is 0.6 $\mu$m or more while the average grain size of the p type semiconductor layer and n type semiconductor layer, on which the aforesaid take off electrodes are formed, is 0.5 $\mu$m or less.

Embodiment 1

FIG. 1 is a cross-sectional view showing a first embodiment of a light emission element using polycrystalline semiconductor material of III-V group component according to the present invention.

The light emission element according to the present embodiment is formed on a large grain size polycrystalline deposition nucleation surface 12 and a small grain size polycrystalline deposition nucleation surfaces $13_1$ and $13_2$ on a substrate 10, and comprises a non-nucleation surface 11 formed on the substrate 10, the large grain size polycrystalline deposition nucleation surface 12 of 10 $\mu$m or more on every side (preferably, 15 $\mu$m or more on every side or most preferably, 20 $\mu$m or more on every side) deposited on the non-nucleation surface 11, a first and second small grain size polycrystalline deposition nucleation surfaces $13_1$ and $13_2$ of 10 $\mu$m or less on every side (preferably, 6 $\mu$m or less on every side or most preferably, 3 $\mu$m or less on every side) formed on the non-nucleation surface 11 to sandwich the large grain size polycrystalline deposition nucleation surface 12, and a n type semiconductor polycrystalline layer 15 and p type semiconductor polycrystalline layer 16 composed of a polycrystalline semiconductor material of III-V group compound sequentially formed with the large grain size polycrystalline deposition nucleation surface 12, and the first and second small grain size polycrystalline deposition nucleation surfaces $13_1$ and $13_2$, a first electrode 17 formed on a part of the surface of the p type semiconductor polycrystalline layer 16 deposited on the second small grain size polycrystalline deposition nucleation surface $13_2$, and a second electrode 19 formed on a part of the n type semiconductor polycrystalline layer 15 deposited on the first small grain size polycrystalline deposition nucleation surface $13_1$. In other words, the light emission element according to the present invention comprises a light emitting area (an area deposited on the large grain size polycrystalline deposition nucleation surface 12) where the n type semiconductor polycrystalline layer 15 are formed with large grain polycrystals, and a wiring area (an area deposited on the first small grain size polycrystalline deposition nucleation surface $13_1$) formed with small grain polycrystals, and the p type semiconductor polycrystalline layer 16 comprises a light emitting area formed with large grain polycrystals (an area deposited on the large grain size polycrystalline deposition nucleation surface 12) and a wiring area formed with small grain polycrystals (an area deposited on the second small grain size polycrystalline deposition nucleation surface $13_2$). These are points different from the conventional light emission element.

Here, the substrate 10 is made of a semiconductor monocrystal such as Si and GaAs, an amorphous substrate such as quartz and ceramic, a high-fusion point metallic substrate such as W and Ti, or the like and it has a thermal resistivity. Also, the non-nucleation surface 11 is formed with $SiO_2$ and $SiN_x$, and has the nucleation density which is smaller than the large grain size polycrystalline deposition nucleation surface 12, the first and second small grain size polycrystalline deposition nucleation surfaces $13_1$ and $13_2$. Further, the n type semiconductor polycrystalline layer 15 and p type semiconductor polycrystalline layer 16 are made of TMG (trimethyl gallium), TEG (triethyl gallium), TMA (trimethyl aluminum), TMIn (triethyl indium), TEIn (triethyl indium), TBAs (tertial butyl arsine), TMAs (trimethyl arsine), DMAs (dimethyl arsine), DEAs (diethy arsine), $AsH_3$, TBP (tertial butyl phosphine), TMP (tertial methyl phosphine), TEP (tertial ethyl phospine), $PH_3$, $NH_3$, and others. In this respect, the doping can be performed using DMSe (dimethyl selenium), DESe (diethyl selenium), DMTe (dimethyl tellurium), DETe (diethyl tellurium), $SiH_4$, DEZn (diethyl zinc), $Cp_2Mg$ (cyclopentane magnesium), $(MeCp)_2Mg$ (methyl cyclopentane magnesium), and others.

Now, using FIG. 10A through FIG. 14B, the description will be made of a method for manufacturing the light emission element shown in FIG. 1, which is a first embodiment of the manufacturing method for light emission elements using a polycrystalline semiconductor material of III-V group compound according to the present invention.

Figure 10A:
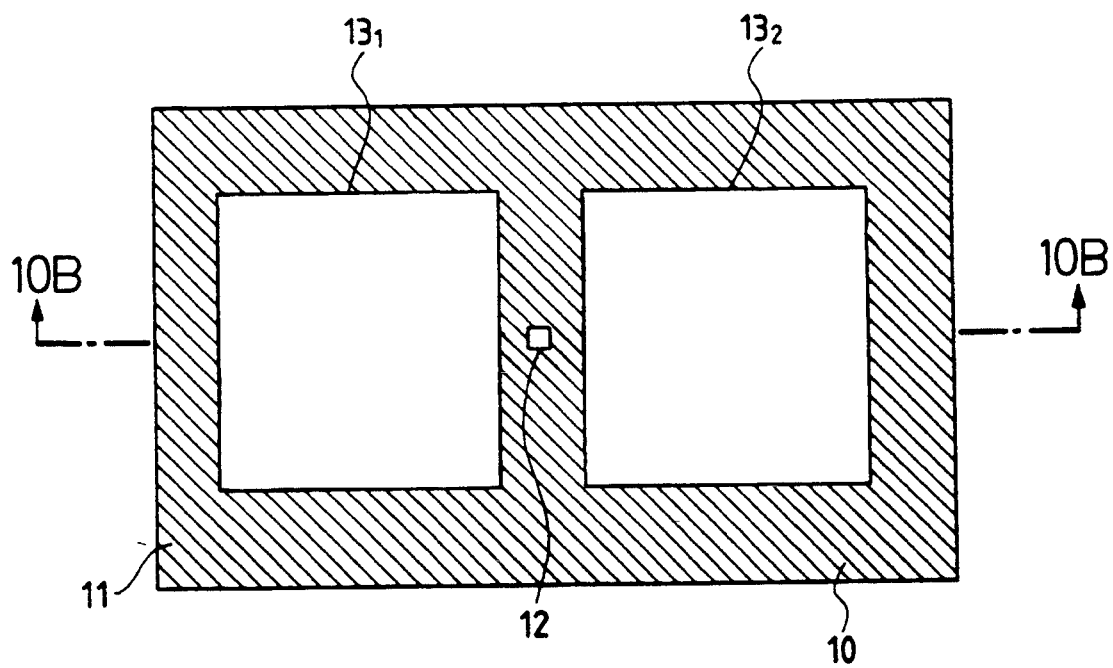
Figure 10B:
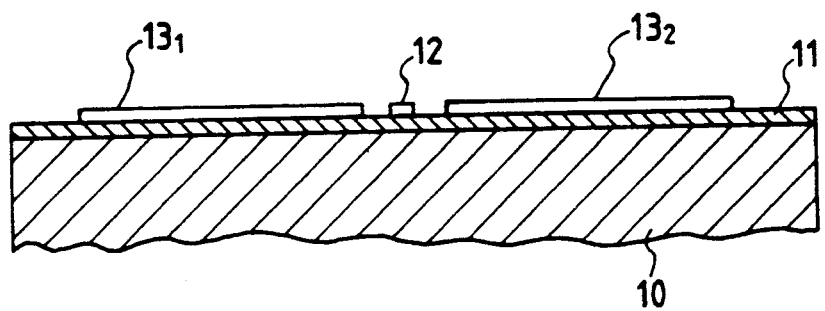
Figure 11A:
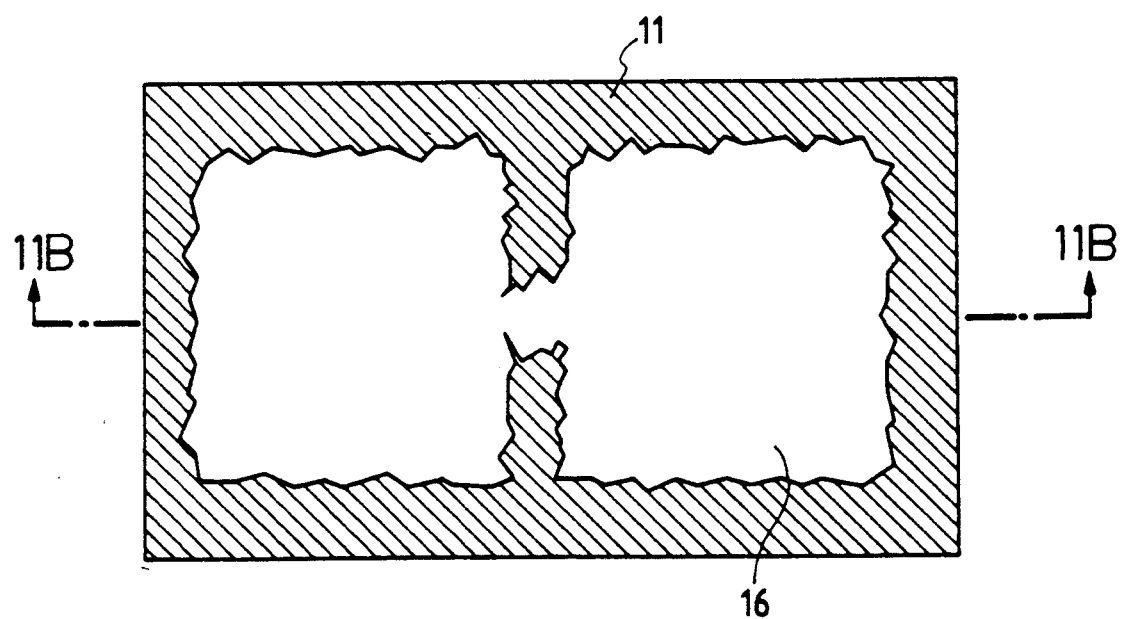
Figure 11B:
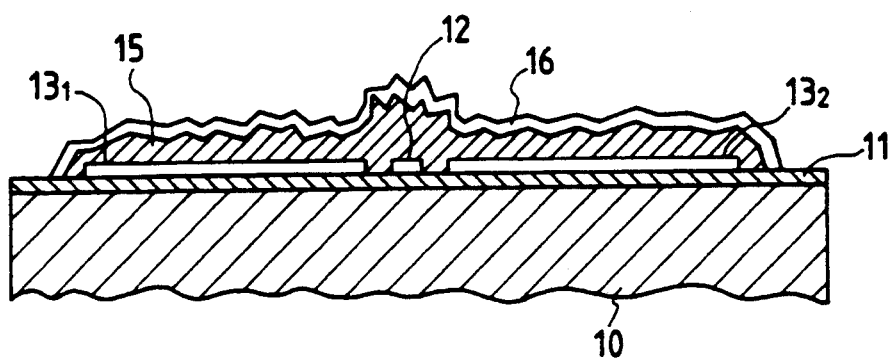

The present manufacturing method differs from the conventional manufacturing method shown in FIGS. 49A to 49E in that it includes the following:

a nucleation surface formation process shown in FIGS. 10A and 10B for forming a large grain size polycrystalline deposition nucleation surface 12 and a first and second small grain size polycrystalline deposition nucleation surfaces $13_1$ and $13_2$; and a semiconductor polycrystalline layer deposition process shown in FIGS. 11A and 11B for depositing the p type semiconductor polycrystalline layer 16 subsequent to having deposited the n type semiconductor polycrystalline layer 15 with the large grain size polycrystalline deposition nucleation surface 12 and the first and second small grain size polycrystalline deposition nucleation surfaces $13_1$ and $13_2$ as its starting point.

Figure 12A:
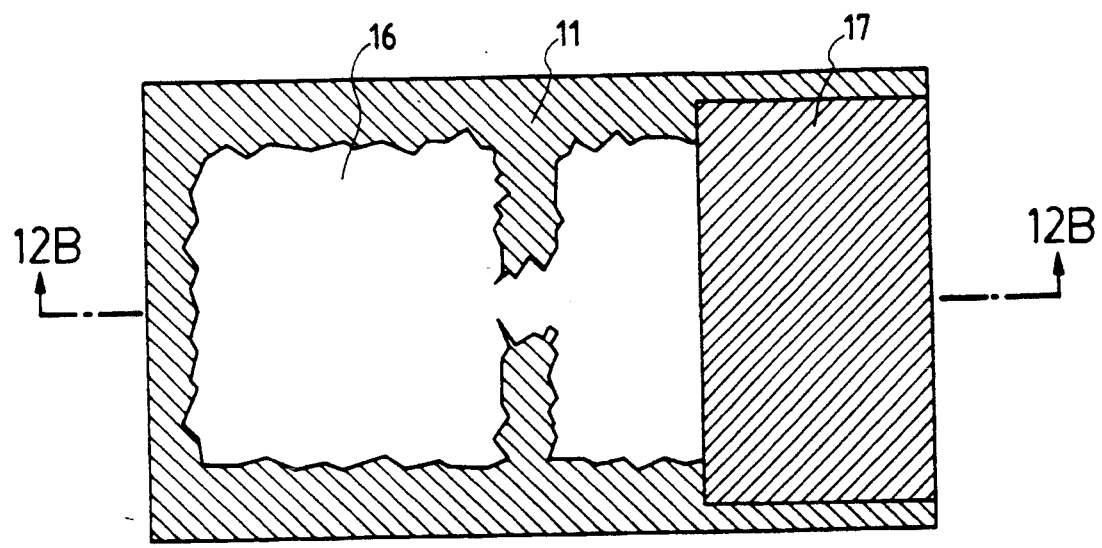
Figure 12B:
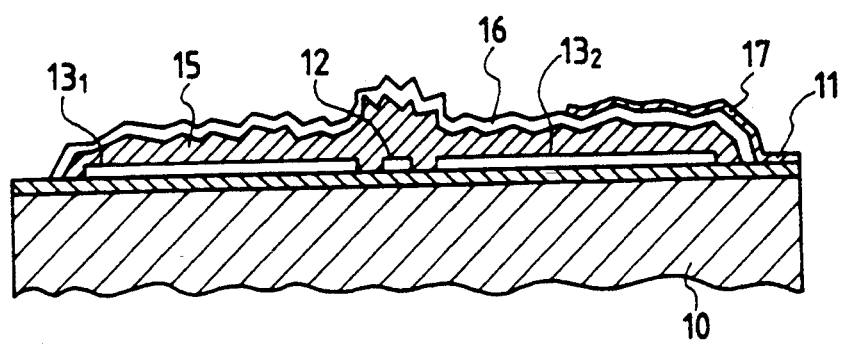
Figure 13A:
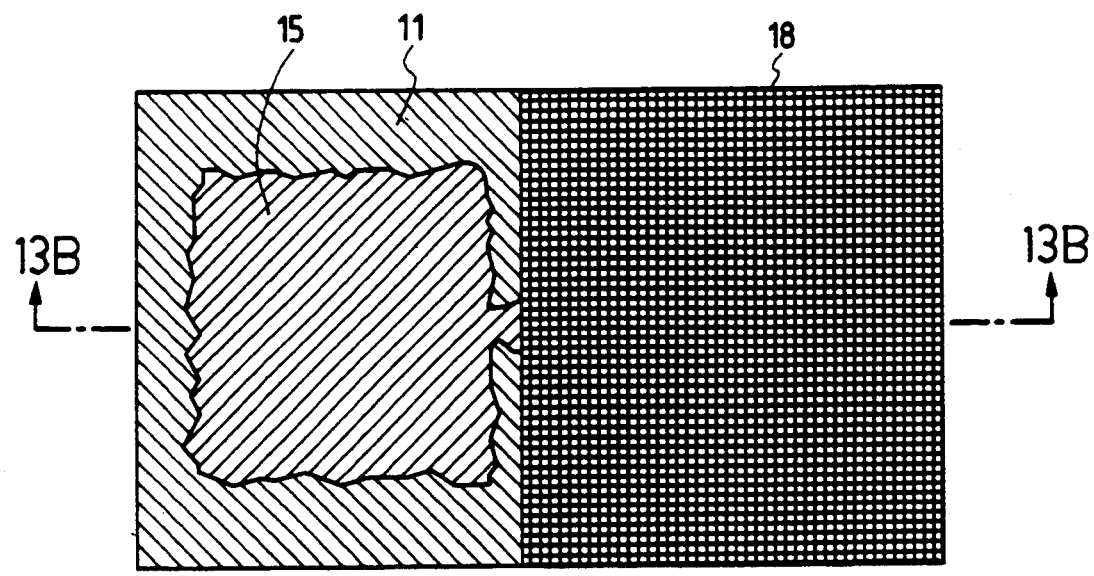
Figure 13B:
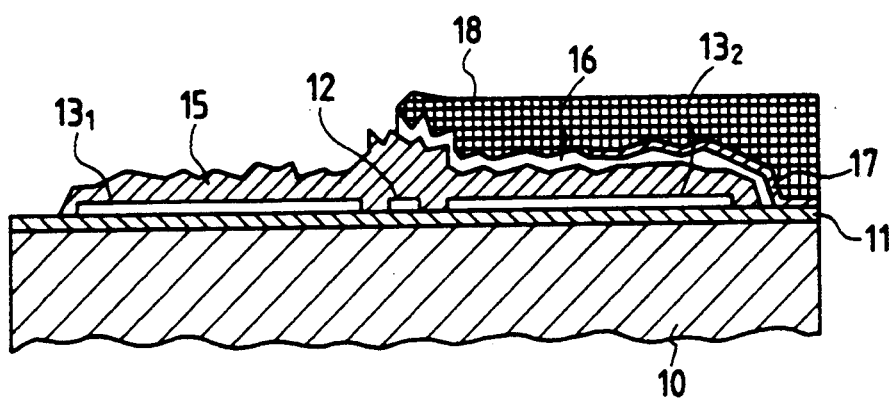
Figure 14A:
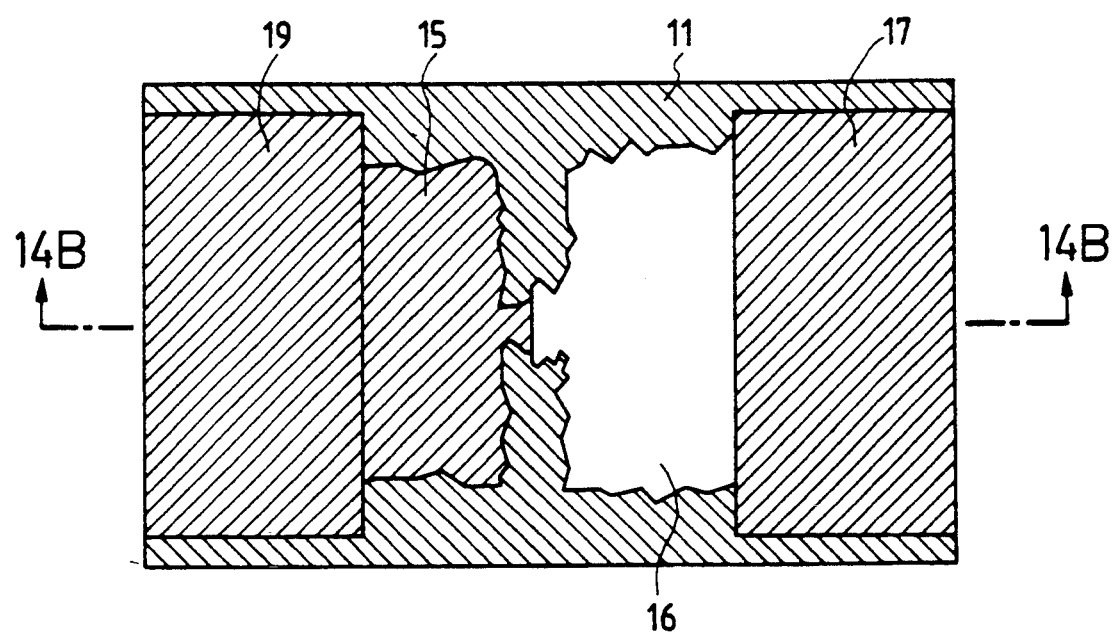
Figure 14B:
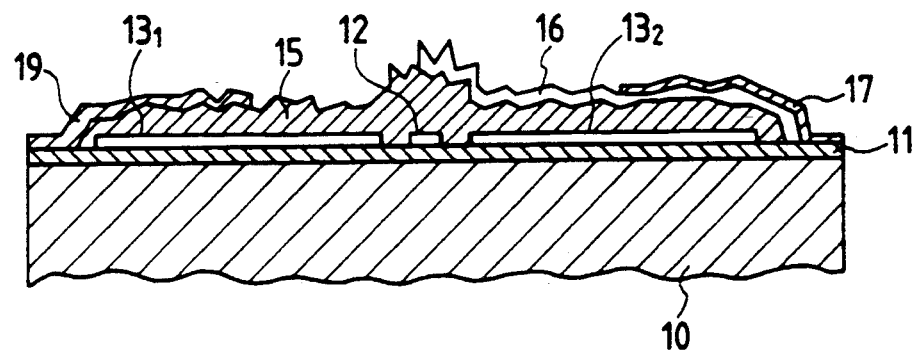

In other words, the present manufacturing method comprises the following:

a non-nucleation surface deposition process for depositing the non-nucleation surface 11 on the substrate 10 by a thermal oxidation treatment, 1 deposition, sputtering, or the like;

a nucleation surface formation process for forming the large grain size polycrystalline deposition nucleation surface 12 and the first and second small grain size polycrystalline deposition nucleation surfaces $13_1$ and $13_2$ by removing the unwanted nucleation surfaces with a wet etching by acid, alkali, or other solution or by a dry etching such as a reactive ion beam etching (RIBE) subsequent to having deposited the non-nucleation surface composed of a non-monocrystalline substance of $Al_2O_3$, $Ta_2O_5$ or the like on the non-nucleation surface 11 by an EB deposition, resistive thermal deposition, or sputtering;

a semiconductor polycrystalline layer formation process for depositing the p type semiconductor polycrystalline layer 16 subsequent to having deposited the n type semiconductor polycrystalline layer 15 with the large grain size polycrystalline deposition nucleation surface 12 and the first and second small grain size polycrystalline nucleation surfaces $13_1$ and $13_2$ as its starting point by an MOCVD method or the like as shown in FIGS. 11A and 11B by utilizing the difference between the nucleation densities of the non-nucleation surface 11, large grain size polycrystalline deposition nucleation surface 12, and the first and second small grain size polycrystalline deposition nucleation surfaces $13_1$ and $13_2$;

a first electrode formation process for forming the first electrode 17 on a part of the surface of the p type semiconductor polycrystalline layer 16 formed on the second small grain size polycrystalline deposition nucleation surface $13_2$ as shown in FIGS. 12A and 12B;

a semiconductor polycrystalline layer removal process for coating resist 18 on an area covering a part of the large grain size polycrystalline deposition nucleation surface 12 and the second small grain size polycrystalline deposition nucleation surface $13_2$ as shown in FIGS. 13A and 13B, and subsequently, removing the p type semiconductor polycrystalline layer 16 on the portion where no resist 18 is coated (an area covering the other part of the large grain size polycrystalline nucleation surface 12 and the first small grain size polycrystalline deposition nucleation surface $13_1$) to allow the surface of the n type semiconductor polycrystalline layer 15 in this portion to be exposed; and a second electrode formation process for forming a second electrode 19 on a part of the n type semiconductor polycrystalline layer 15 the surface of which is exposed as shown in FIGS. 14A and 14B in the same manner as the first electrode 17 as shown in FIGS. 12A and 12B.

Here, the deposition conditions for the semiconductor layer formation process shown in FIGS. 11A and 11B are: deposition temperatures, 50° to 1,200° C. (for nitride, 800° to 1,200° C.); pressure, 80 Torr or less (preferably, 30 Torr or less or most preferably, 20 Torr or less); and deposition time, a time to be set depending on the sizes of semiconductor element. However, the deposition conditions are more dependent on the types of equipment. Accordingly, it is necessary to change them in accordance with the equipment to be used. Also, for a patterning method to be employed for the first electrode formation process shown in FIGS. 12A and 12B, it is possible to use either a lift-off method (in which a patterning is performed by resist in advance to form the first electrode 17, and then the resist is peeled off) or a method whereby the unwanted portion is removed subsequent to having formed electrodes all over an area.

Embodiment 2

Using FIG. 15A through FIG. 19B, a second embodiment of a light emission element using a polycrystalline semiconductor material of III-V group compound and manufacturing method therefor will be described.

The manufacturing method for light emission elements according to the present embodiment comprises each of the processes given below.

Figure 15A:
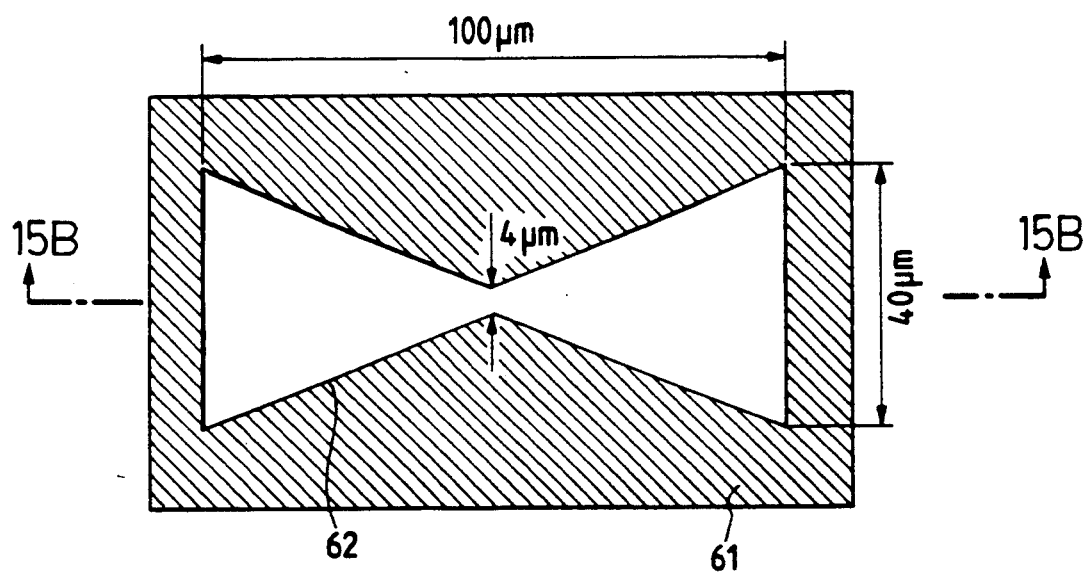
Figure 15B:
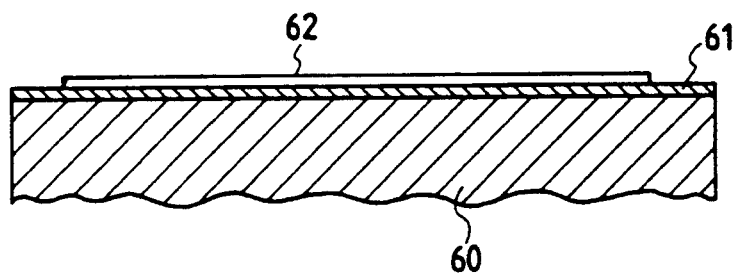

(1) Non-nucleation surface deposition process... As shown in FIG. 15B, an Si substrate 60 is used as a substrate, and an SiN film 61 (film thickness 0.1 μm) which becomes a non-nucleation surface is formed on the Si substrate 60 by an EB deposition. Here, the EB deposition is performed by supplying oxygen into a vacuum atmosphere of $1 \times 10^{-6}$ Torr in flow rate of 10 cc/min.

(2) Nucleation surface formation process... Subsequent to having formed an AlN film (film thickness 0.05 μm) on the SiN film 61 by the EB deposition, unwanted AlN film is removed by a mixed solution of $H_2SO_4$ and $H_2SO_2$. Then, as shown in FIG. 15A, a polycrystalline deposition nucleation surface 62 is formed in a shape such that the vertices of two triangles of approximately 50 μm high with the base of 40 μm long each are overlapped to be a width of 4 μm at its contacting point. Here, the EB deposition is performed in the same manner as in the above-mentioned (1).

Figure 16A:
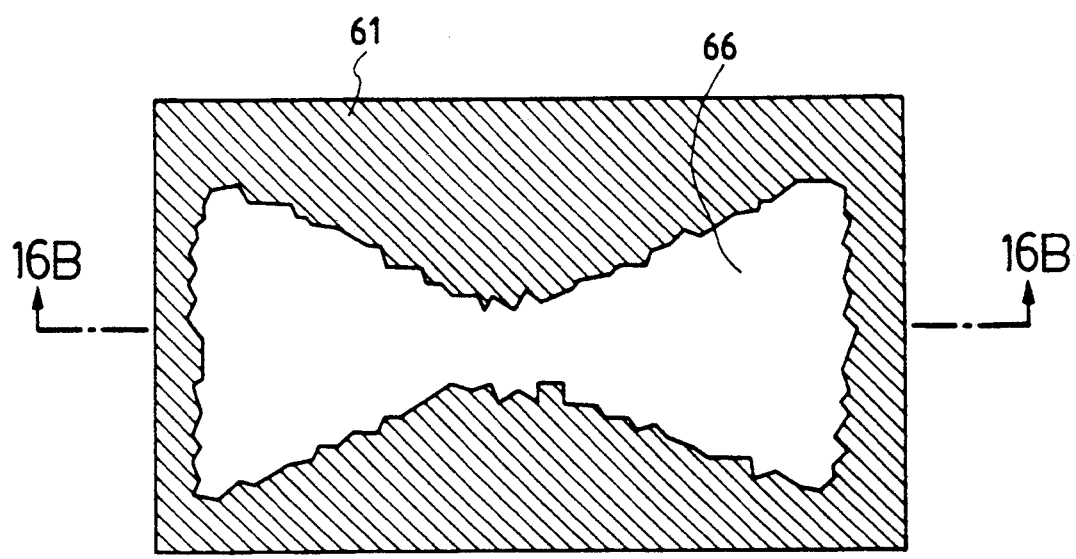
Figure 16B:
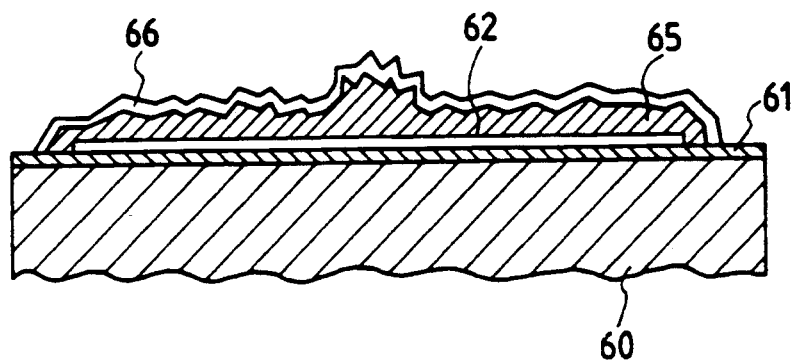

(3) Semiconductor polycrystalline layer formation process... Using an MOCVD method, the p type GaAs polycrystalline layer 66 is formed subsequent to having formed the n type GaAs polycrystalline layer 65 with the polycrystalline deposition nucleation surface 62 as its starting point as shown in FIGS. 16A and 16B. In Table 4, the polycrystal deposition conditions for this process are shown.

TABLE 4

| Item | Deposition Conditions |
|---|---|
| III group material gas | TMG $2.0 \times 10^{-7}$ mol/min |
| V group material gas | $AsH_3$ $1.8 \times 10^{-5}$ mol/min |
| Etching gas | HCl $1.4 \times 10^{-7}$ mol/min |
| Carrier gas | $H_2$ 10 l/min |
| Doping gas | DEZn $6.0 \times 10^{-8}$ mol/min (p type) |
| | $SiH_4$ $5.9 \times 10^{-8}$ mol/min (n type) |
| Substrate temperature | 670° C. |
| Pressure | 20 Torr |
| Deposition time | 45 min (n type) |
| | 15 min (p type) |
| V/III ratio | 40 |

Figure 17A:
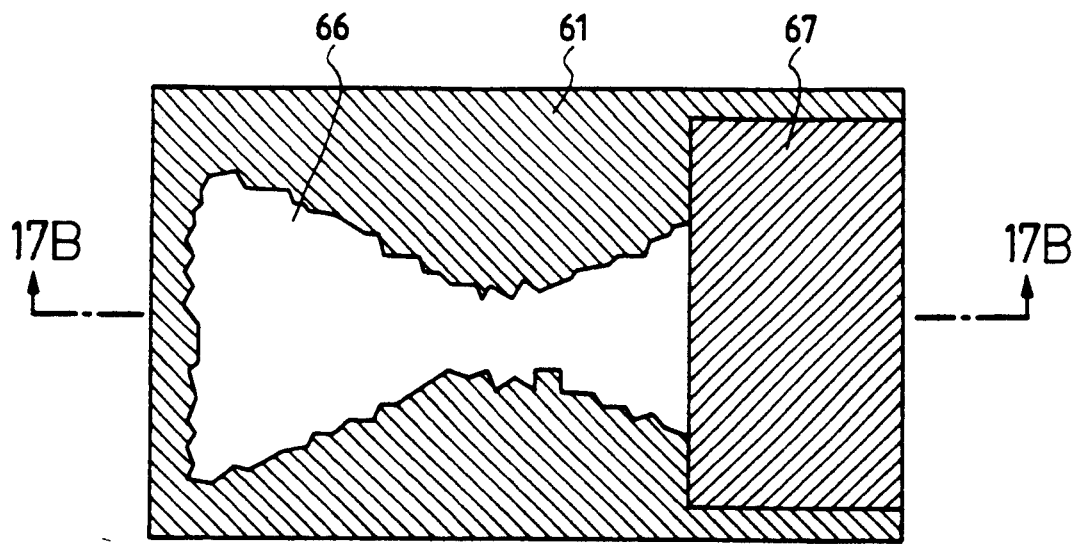
Figure 17B:
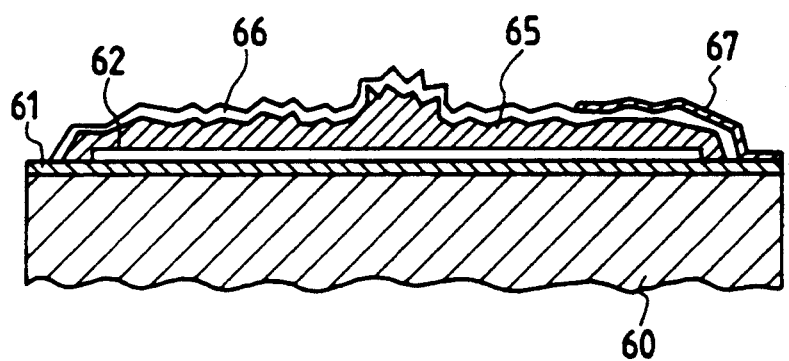

(4) A first electrode formation process... As shown in FIGS. 17A and 17B, resist (film thickness 5 μm) is coated on the portions other than the portion where the Cr/Au electrode 67 is formed, and after Cr (500 Å) and Au (5,000 Å) are deposited by a resistive thermal deposition, the Cr/Au electrode 67 is formed by performing an ultrasonic cleaning in a resist peeling solution for 20 minutes.

Figure 18A:
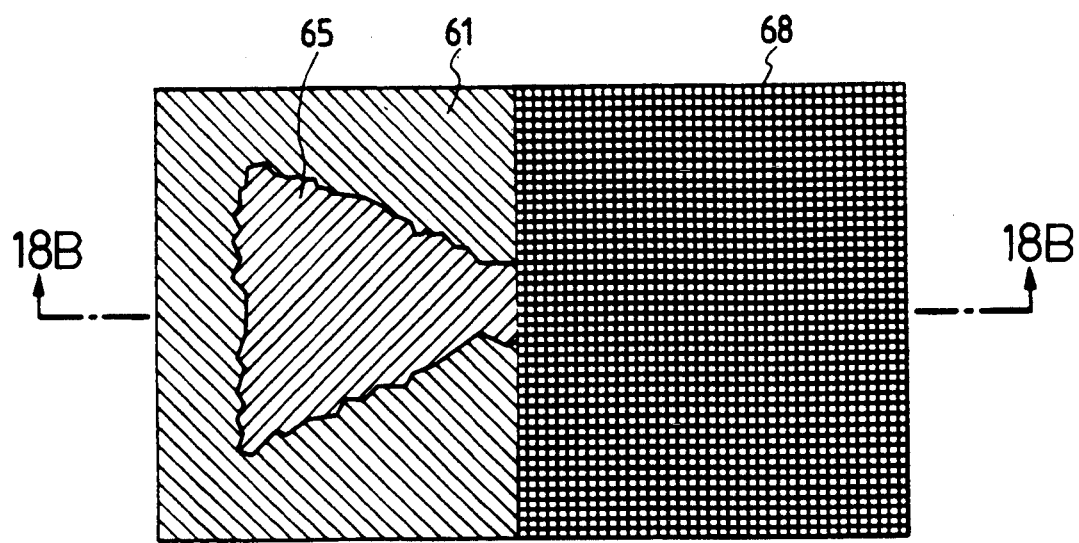
Figure 18B:
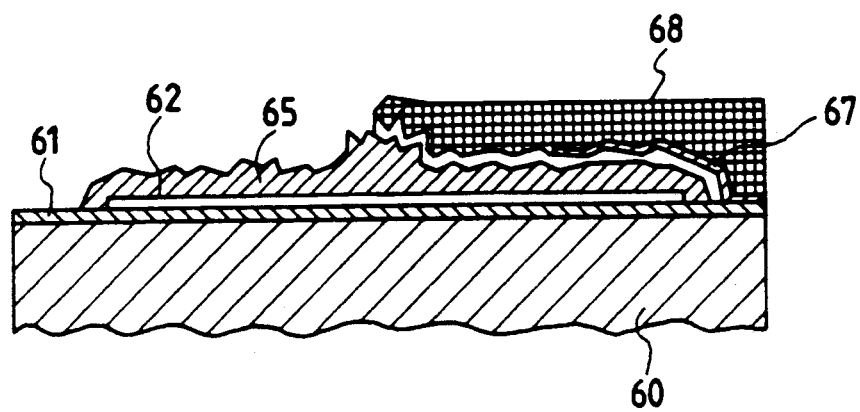

(5) Semiconductor polycrystalline layer removal process... As shown in FIGS. 18A and 18B, subsequent to having coated resist 68 on half the Si substrate 60 on its right-hand side, the p type GaAs polycrystalline layer 66 is etched with the resist 68 as a mask until half the surface of the n type GaAs polycrystalline layer 65 on the left-hand side is exposed. The etching is performed by immersing the specimen in a mixed solution of $CH_3COOH$, $H_2O_2$, $H_2SO_2$, $H_2O$ for 15 seconds.

Figure 19A:
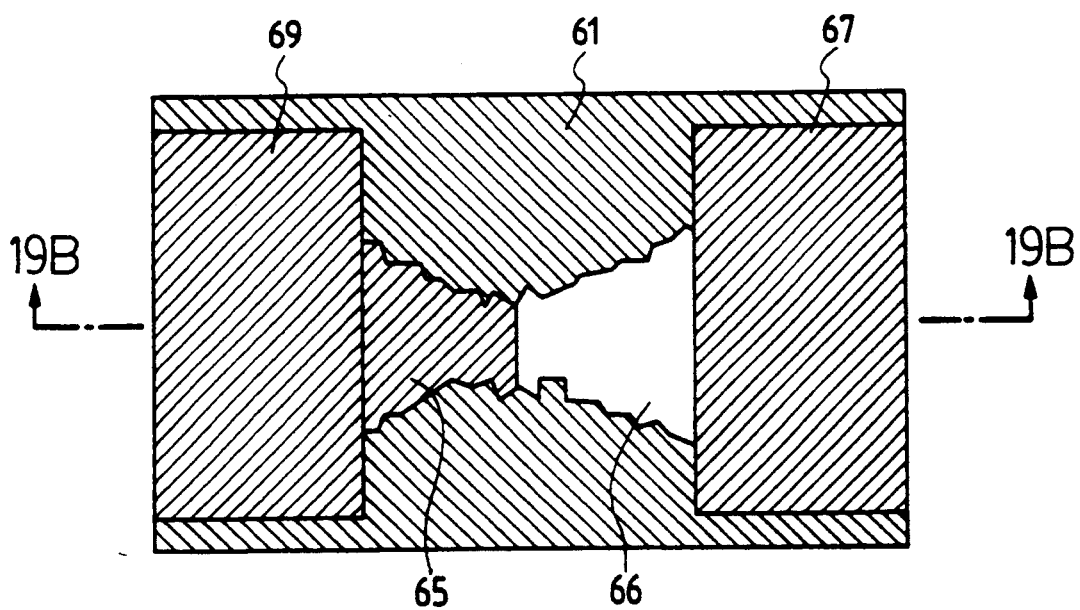
Figure 19B:
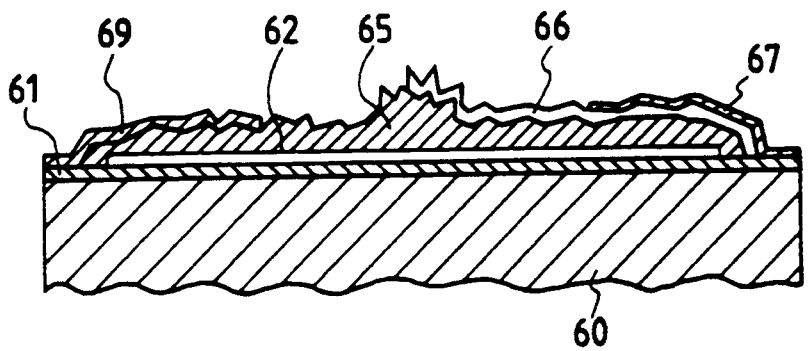

(6) A second electrode formation process . . . As shown in FIGS. 19A and 19B, resist (film thickness 5 μm) is coated on the portions other than the portion where the AuGe/Au electrode 69 is formed, and after AuGe (2,000 Å) and Au (5,000 Å) are deposited by a resistive thermal deposition, the AuGe/Au electrode 69 is formed by performing an ultrasonic cleaning in a resist peeling solution for 20 minutes.

Now, a thermal treatment is given to the specimen produced as described above at a temperature of 420° C. in an Ar atmosphere for 10 minutes for fabricate a light emission element. The n type GaAs polycrystalline layer 65 of this light emission element is deposited with the polycrystalline deposition nucleation surface 62 having such a shape as shown in FIG. 15A as its starting point. As a result, the grain size is large in the center thereof while it becomes increasingly smaller as it approaches both ends, and as shown in the case of the light emission element shown in FIG. 1, this layer comprises a light emitting area (the central part) formed by large grain polycrystals and a wiring area (on the left-side end) formed by small grain polycrystals. Likewise, the p type GaAs polycrystalline layer 66 comprises a light emitting area (the central part) formed by large grain polycrystals and a wiring area (on the right-side end) formed by small grain polycrystals. Therefore, it is possible to enhance the light emission efficiency and at the same time, to improve the reliability of the Cr/Au electrode 67 and AuGe/Au electrode 69 against disconnections. Also, the fluctuation range of the measured values of the electrical resistance of the Cr/Au electrode 67 and AuGe/Au electrode 69 is 30 to 90Ω, which is smaller than the fluctuation range of the measured values of the electrical resistance, 30 to 300Ω, of the light emission element fabricated according to the conventional manufacturing method.

Embodiment 3

Using FIG. 20A through FIG. 24B, a third embodiment of a light emission element using a polycrystalline semiconductor material of III-V group compound and manufacturing method therefor will be described.

The manufacturing method for light emission elements according to the present embodiment uses a quartz substrate 70 which serves as the non-nucleation surface durally. Accordingly, there is no need for the non-nucleation surface deposition process. In other words, the manufacturing method for light emission elements according to the present embodiment comprises each of the processes given below.

Figure 20A:
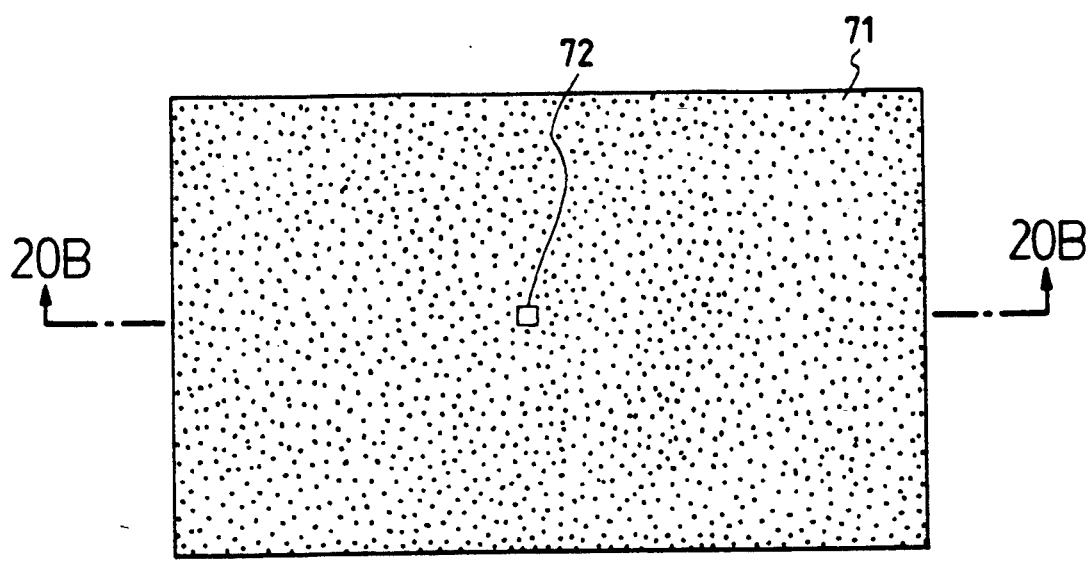
Figure 20B:
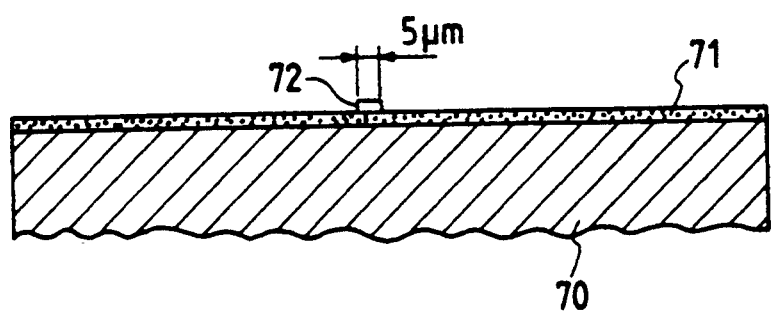
Figure 21A:
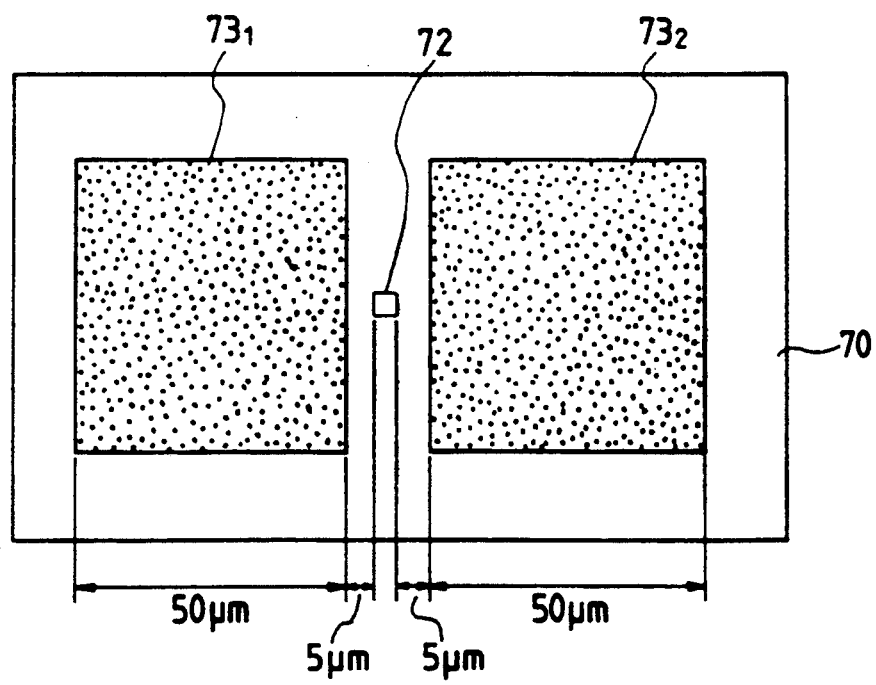
Figure 21B:
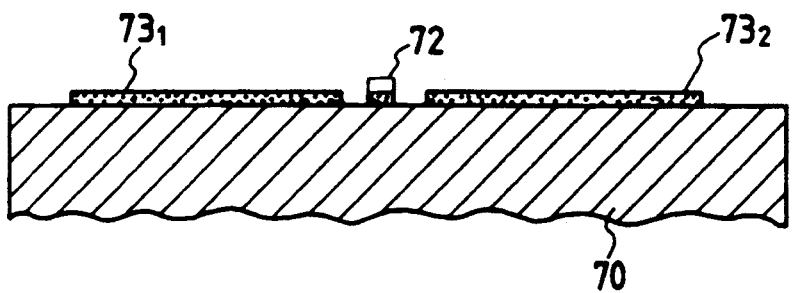

(1) Non-nucleation surface deposition process. . . A quartz substrate 70 is used as a substrate, and a polysilicon film 71 (film thickness 0.1 μm) shown in FIG. 20B is deposited on the quartz substrate 70 by a CVD method. Here, the CVD conditions are: deposition temperature, 620° C. and $SiH_4$ being supplied in an atmosphere of 0.2 Torr pressure in a flow rate of 45 cc/min for 10 minutes. Subsequently, after an AlN film (film thickness 0.1 μm) is formed on the polysilicon film 71 by an EB deposition, the AlN film is removed on the portions other than the portion where the AlN film of 5 μm on every side, which becomes the large grain size polycrystalline deposition nucleation surface 72, is left in the center of the quartz substrate 70 as shown in FIG. 20A. Here, the EB deposition is performed by supplying oxygen into a vacuum atmosphere of 1×10 Torr in a flow rate of 10 cc/min. Also, the removal of the AlN film is carried out by immersing the specimen in the mixed solution of $H_2SO_4$ and $H_2SO_2$ for 40 seconds after covering its portion to be set aside with resist. Then, as shown in FIG. 21A, the polysilicon films 71 of 50 μm on every side are each set aside at the positions sandwiching the large grain size polycrystalline deposition nucleation surface 72 apart therefrom 5 μm each, which become the first and second small grain size polycrystalline deposition nucleation surfaces $73_1$ and $73_2$, all the other polysilicon films 71 are removed. Here, the removal of the polysilicon film 71 is performed by immersing the specimen in a mixed solution of HF and $H_2O_2$ for 30 seconds after covering with resist the large grain size crystalline deposition nucleation surface 72 and the first and second small grain size polycrystalline deposition nucleation surfaces $73_1$ and $73_2$.

Figure 22A:
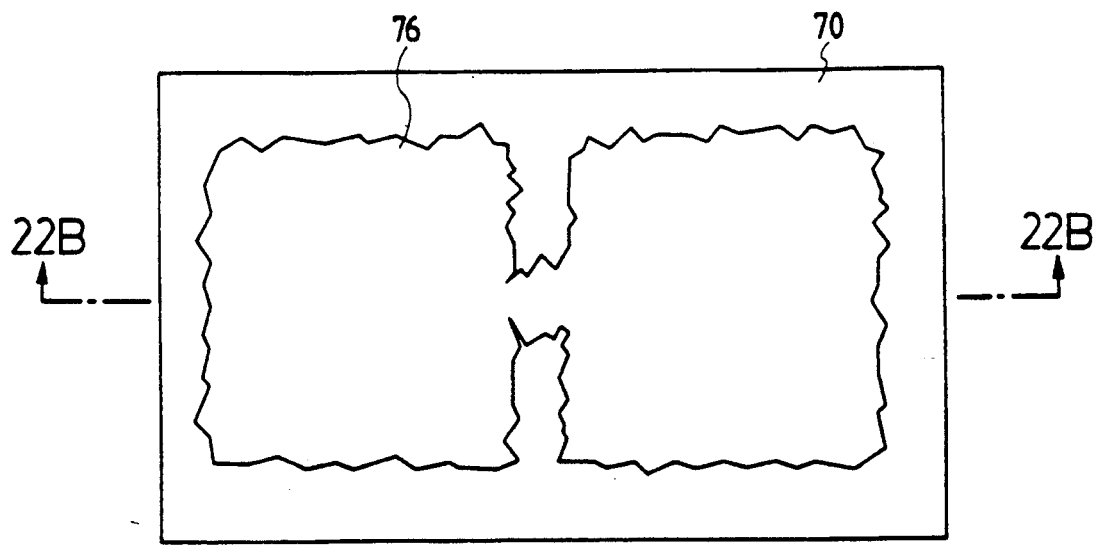
Figure 22B:
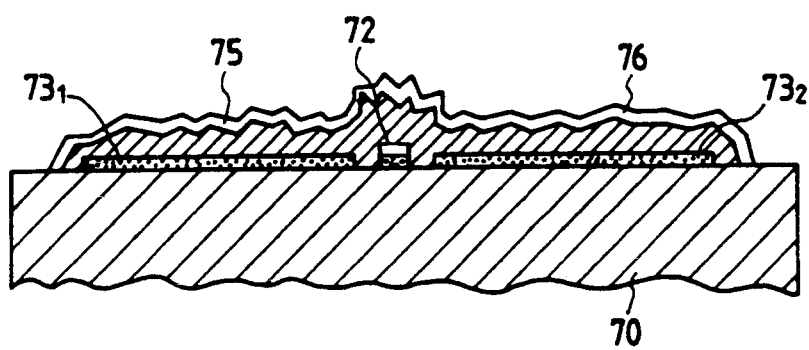

(2) Semiconductor polycrystalline layer formation process . . . Using an MOCVD method, the p type GaAs polycrystalline layer 76 (carrier density $n=1\times10^{18}$ cm$^{-3}$) is deposited subsequent to having deposited the n type GaAs polycrystalline layer 75 (carrier density $n=1\times10^{18}$ cm$^{-3}$) with the large grain size polycrystalline deposition nucleation surface 72 and the first and second small grain size polycrystalline deposition nucleation surfaces $73_1$ and $73_2$ as its starting point as shown in FIGS. 22A and 22B. In Table 5, the polycrystal deposition conditions for this process are shown. Table 5. Deposition Condtions

TABLE 5

| Item | Deposition Conditions |
|---|---|
| | Deposition Conditions |
| III group material gas | TMG 2.0 × 10$^{-7}$ mol/min |
| V group material gas | AsH$_3$ 1.8 × 10$^{-5}$ mol/min |
| Etching gas | HCl 1.4 × 10$^{-7}$ mol/min |
| Carrier gas | H$_2$ 10 l/min |
| Doping gas | DeZn 6.0 × 10$^{-8}$ mol/min (p type) |
| | SiH$_4$ 5.9 × 10$^{-8}$ mol/min (n type) |
| Substrate temperature | 670° C. |
| Pressure | 20 Torr |
| Deposition time | 45 min (n type) |
| | 15 min (p type) |
| V/III ratio | 40 |

Figure 23A:
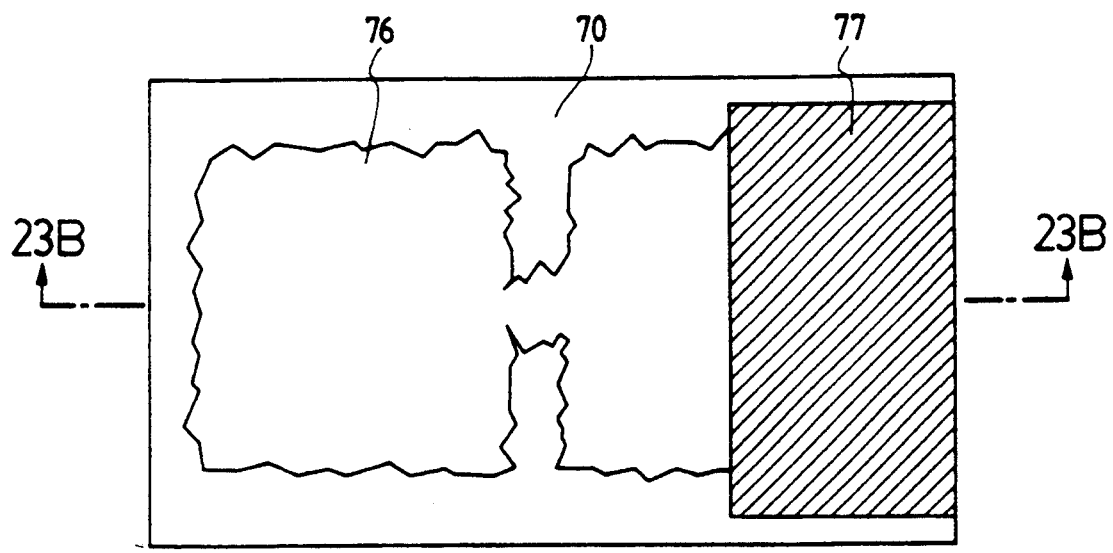
Figure 23B:
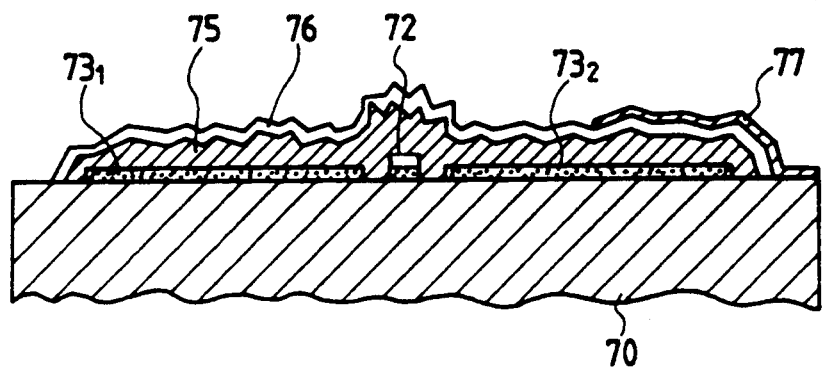

(3) A first electrode formation process . . . As shown in FIGS. 23A and 23B, resist (film thickness 5 μm) is coated on the portions other than the portion where the Cr/Au electrode 67 is formed, and after Cr (500 Å) and Au (5,000 Å) are deposited by a resistive thermal deposition, the Cr/Au electrode 77 is formed by performing a ultrasonic cleaning in a resist peeling solution for 20 minutes.

Figure 24A:
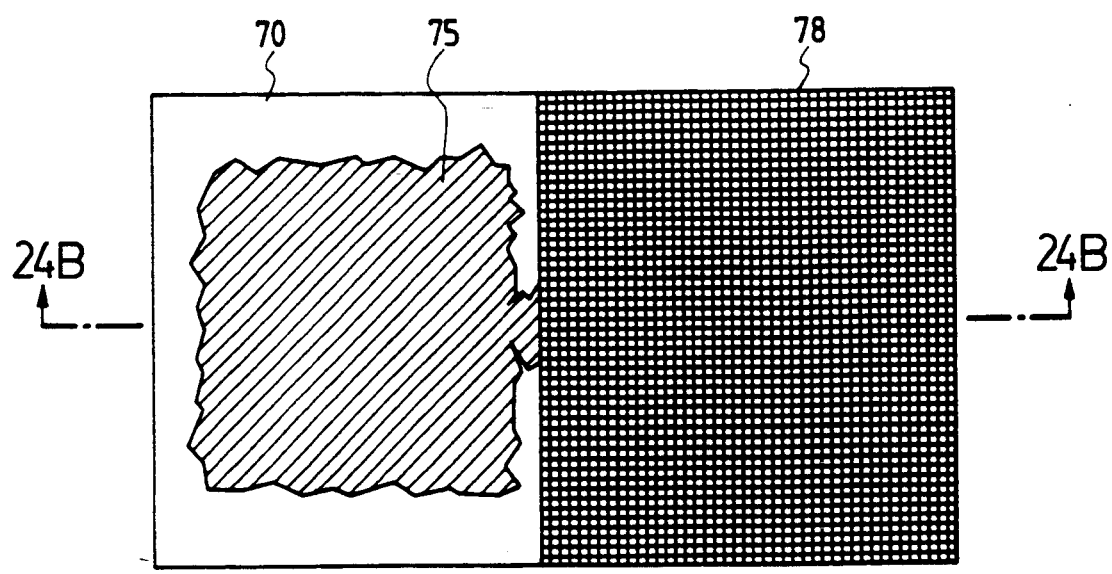
Figure 24B:
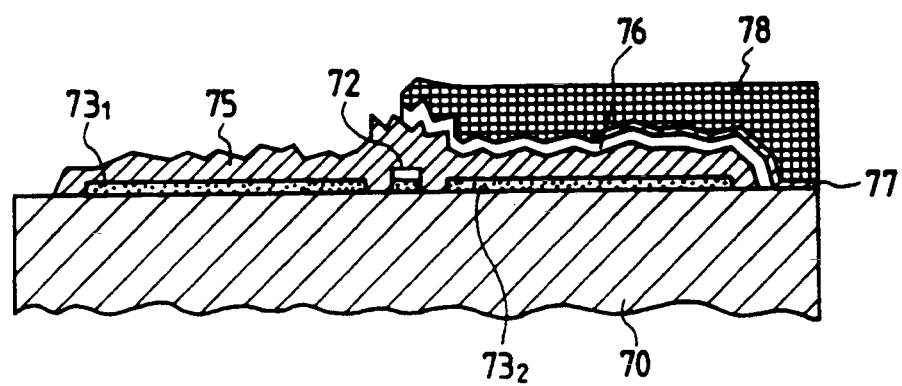

(4) Semiconductor polycrystalline layer removal process . . . As shown in FIGS. 24A and 24B, subsequent to having coated resist 78 on half the quartz substrate 70 on its right-hand side, the p type GaAs polycrystalline layer 76 is etched with the resist 78 as a mask until half the surface of the n type GaAs polycrystalline layer 75 on the left-hand side is exposed. The etching is performed by immersing the specimen in a mixed solution of $CH_3COOH$, $H_2O_2$, $H_2SO_2$, $H_2O$ for 45 seconds.

Figure 25A:
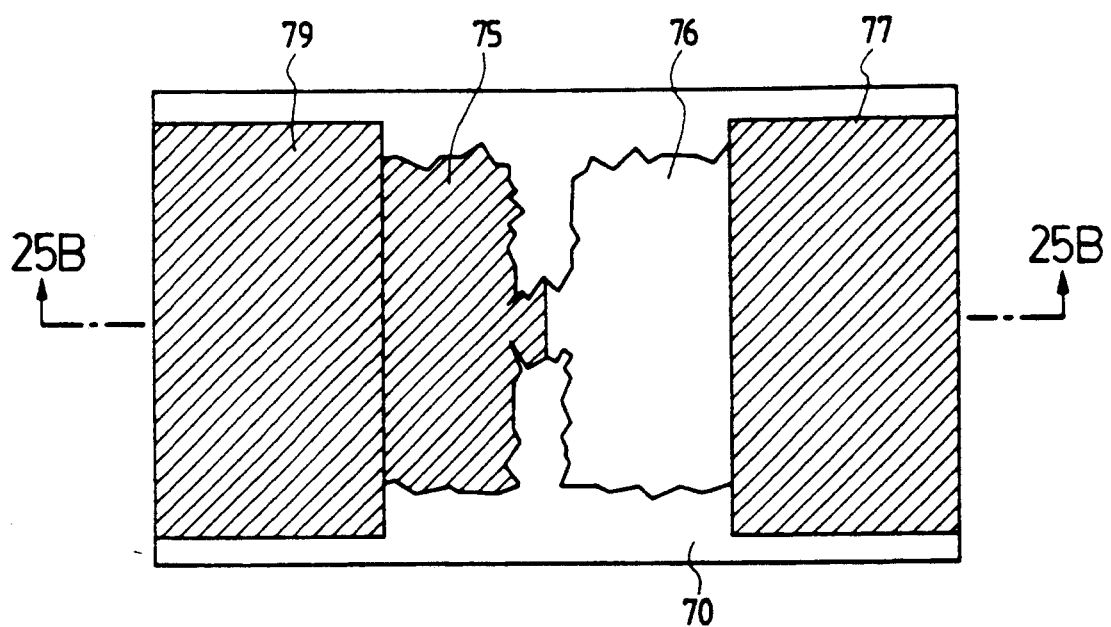
Figure 25B:
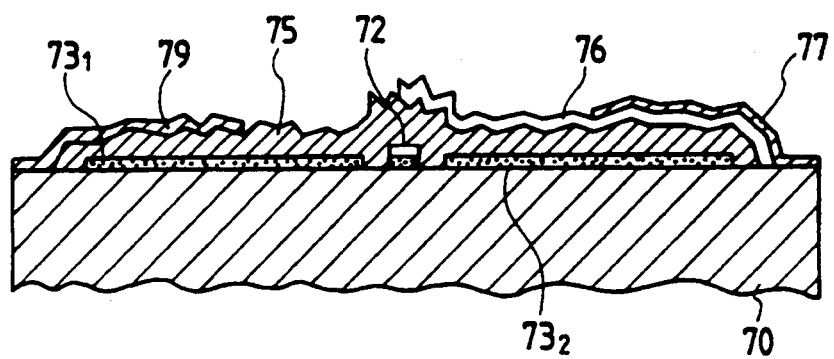

(5) A second electrode formation process... As shown in FIGS. 25A and 25B, resist (film thickness 5 μm) is coated on the portions other than the portion where the AuGe/Au electrode 79 is formed, and after AuGe (2,000 Å) and Au (5,000 Å) are deposited by a resistive thermal deposition, the AuGe/Au electrode 79 is formed by performing a ultrasonic cleaning in a resist peeling solution for 20 minutes.

Now, a thermal treatment is given to the specimen produced as described above at a temperature of 420° C. in an Ar atmosphere for 10 minutes to fabricate a light emission element. The light emission element thus produced is operated continuously for 10 hours at 20 mA. Then, the result is that the disconnection probability of the Cr/Au electrode 77 and AuGe/Au electrode 79 is 8%, which is smaller than the disconnection probability of the electrode of the conventional light emission element obtained by the same manner, which is 20%.

Subsequently, using FIG. 26A through FIG. 29, the description will be made of another example of a method for forming the polycrystalline deposition nucleation surface which becomes the starting point for depositing the n type semiconductor polycrystalline layer and p type semiconductor polycrystalline layer.

Figure 26A:
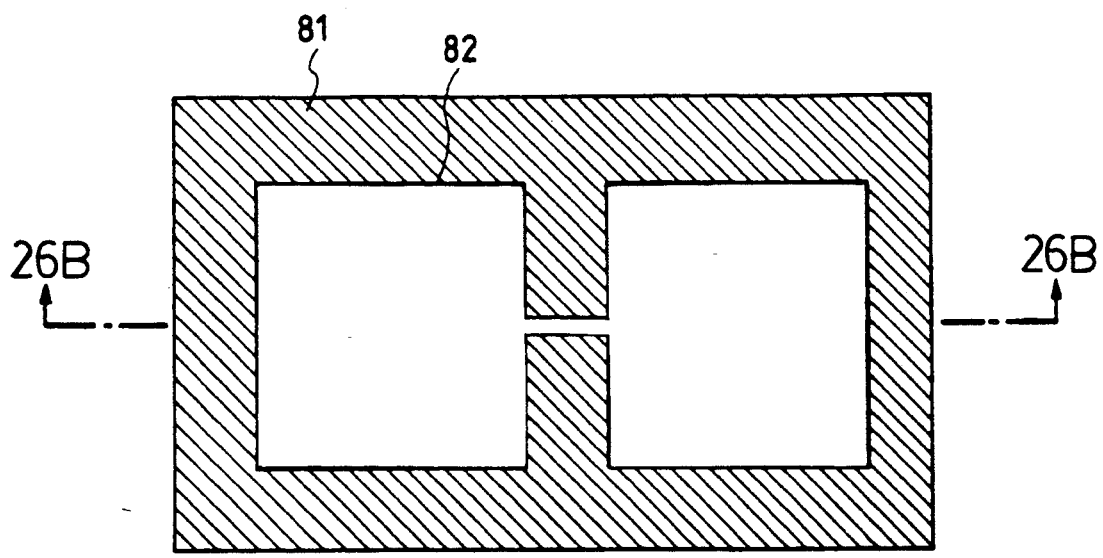
Figure 26B:
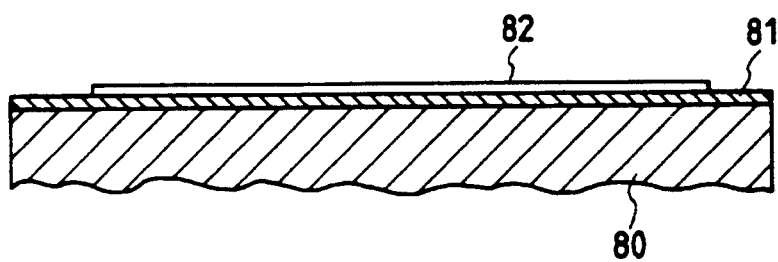

The polycrystalline deposition nucleation surface 82 shown in FIGS. 26A and 26B has a shape in which the large grain size polycrystalline deposition nucleation surface 12 shown in FIG. 10 and the first and second small grain size polycrystalline deposition nucleation surfaces $13_1$ and $13_2$ are coupled. In this case, too, the grain sizes of the n type semiconductor polycrystalline layer and p type semiconductor polycrystalline layer deposited with the central part (the portion having a small area) of the polycrystalline deposition nucleation surface 82 are larger than the grain sizes of the n type semiconductor polycrystalline layer and p type semiconductor layer deposited with the left- and right-hand sides (the portions having large areas) of the polycrystalline deposition nucleation surface 82. Therefore, it is possible to fabricate a light emission element having the same structure as the light emission element shown in FIG. 1.

Figure 27:
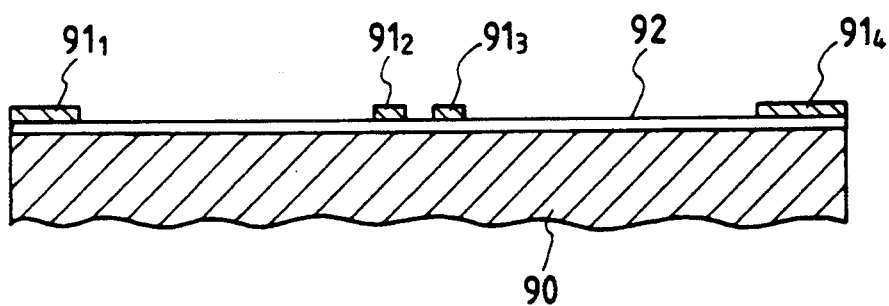
FIG. 27 is a schematic view illustrating another example of the method for a polycrystalline deposition nucleation surface formation with an n type semiconductor polycrystalline layer and p type semiconductor polycrystalline layer as its deposition starting point.

Also, as shown in FIG. 27, by removing the unwanted portion of the non-nucleation surface deposited on the polycrystalline deposition nucleation surface 92 after depositing the polycrystalline deposition nucleation surface 92 on the substrate 90, the polycrystalline deposition nucleation surface 92 is divided into three portions (a portion surrounded by the first non-nucleation surface $91_1$ and second non-nucleation surface $91_2$, a portion surrounded by the second non-nucleation surface $91_2$ and third non-nucleation surface $91_3$, and a portion surrounded by the third non-nucleation surface $91_3$ and fourth non-nucleation surface $91_4$). Even when this division takes place, the grain sizes of the n type semiconductor polycrystalline layer and p type semiconductor polycrystalline layer deposited with the second non-nucleation surface $91_2$ and third non-nucleation surface $91_3$ as its starting point are larger than the grain sizes of the n type semiconductor polycrystalline layer and p type semiconductor polycrystalline layer deposited with the other portions as its starting point. It is therefore possible to fabricate a light emission element having the same structure as the light emission element shown in FIG. 1.

Figure 28:
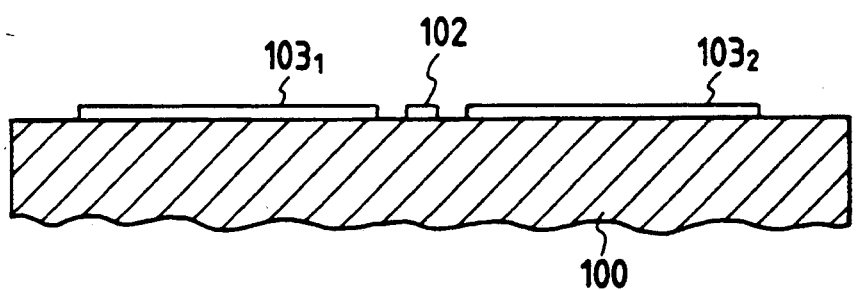
FIG. 28 is a schematic view illustrating another example of the method for a polycrystalline deposition nucleation surface formation with an n type semiconductor polycrystalline layer and p type semiconductor polycrystalline layer as its deposition starting point.
Figure 29:
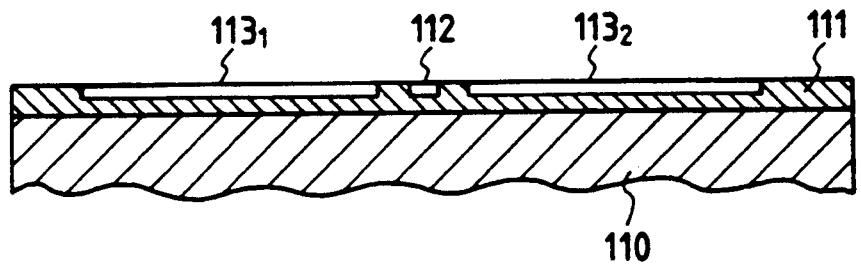
FIG. 29 is a schematic view illustrating another example of the method for a polycrystalline deposition nucleation surface formation with an n type semiconductor polycrystalline layer and p type semiconductor polycrystalline layer as its deposition starting point.

Further, as shown in FIG. 28, it may be possible to form the large grain size polycrystalline deposition nucleation surface 102 and the first and second small grain size polycrystalline deposition nucleation surfaces $103_1$ and $103_2$ on a quartz substrate 100 which can be a non-nucleation surface, or as shown in FIG. 29, it may be possible to form the large grain size polycrystalline deposition nucleation surface 112 and the first and second small grain size polycrystalline deposition surfaces $113_1$ and $113_2$ by implanting ion of As, P, or the like partially in the non-nucleation surface 111 deposited on the substrate 110.

Figure 30A:
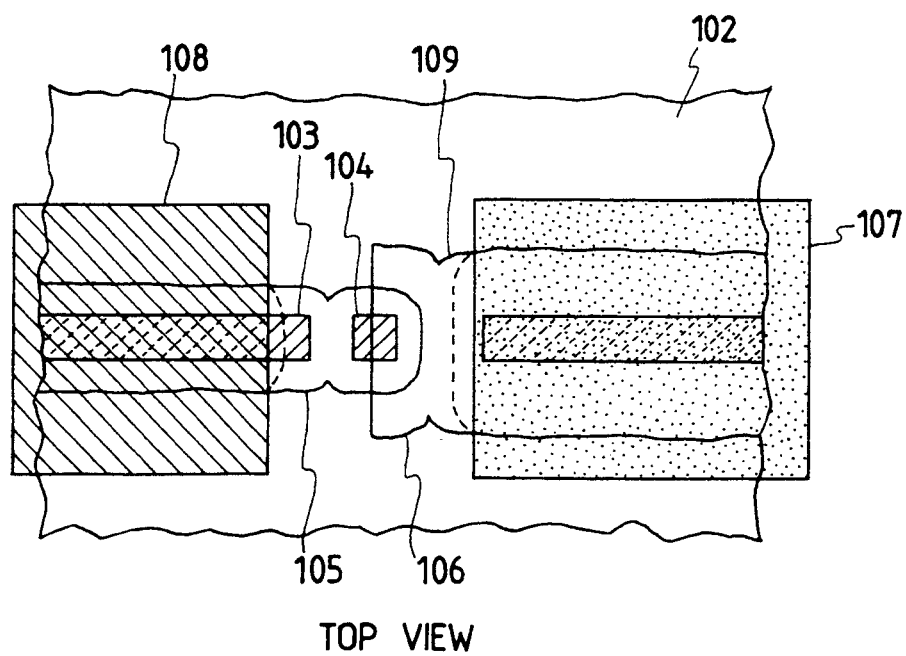
FIGS. 30A and 30B are schematic views showing an example of a light emission element.
Figure 30B:
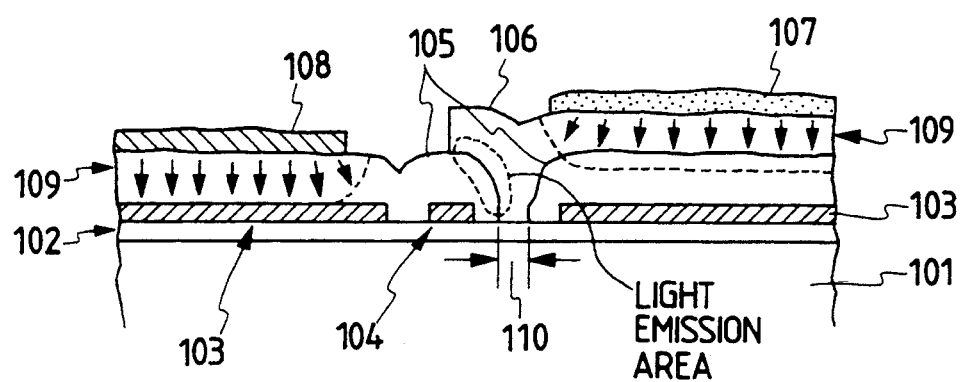

FIGS. 30A and 30B are views schematically showing another embodiment of a selective deposition polycrystalline light emission element according to the present invention. On a base material 101 (a ceramic, carbon, polysilicon, quartz, or high-fusion point glass such as $Al_2O_3$, Aln, or BN, or a high-fusion point metal such as W, Mo, or Ti), a thin film 102 made of a low crystalline nucleation density ($SiO_2$, $Si_3N_4$ or other amorphous substance, for example) is deposited for a non-nucleation surface.

On the thin film, a fine square or strip is formed with a material having higher nucleation surface density (such as non-monocrystalline polysilicon, AlN, $Al_2O_3$, $Ta_2O_5$, TiN, $TiO_2$, $WO_3$) to form a nucleation surfaces 103 to 104 (in general, one side being 1 to 8 μm, preferably, 1 to 6 μm, or most preferably, 1 to 3 μm).

At this time, the nucleation surface 104 of the LED formation portion is arranged asymmetrically to the nucleation surface 103 of the take off portions of the p type and n type electrodes (arrange close to either one of the take off portions of the p type and n type).

Thereafter, using an MOCVD method, the polycrystals of III-V group compound are sequentially deposited in the order of p type and n type or n type and p type by switching the doping gas accordingly.

For the semiconductor materials of III-V group compound, those named earlier can be employed.

The substrate temperature in this case are generally 570° to 850° C., preferably, 600° to 800° C., or most preferably, 660° to 780° C. The reaction pressure is generally 100 torr or less, preferably, 50 torr or less, or most preferably, 4 to 30 torr. The supply molar ratio of the V group/III group materials is generally 10 to 150, preferably, 30 to 80, or most preferably, 40 to 70. While HCl is introduced as an etching gas, its flow rate against the total gas flow rate is generally $7 \times 10^{-4}$ to $6 \times 10^{-2}$ mol %, preferably, 1 to $5 \times 10$ mol %, or most preferably, 2 to $3 \times 10^{-3}$ mol %.

Then, a deposition time is controlled so as not to allow the layer (p type or n type) 105 to be grown in succession when deposited on the nucleation surface for the first time to provide a space 110 beneath the take off electrode. Because of the presence of this space 110, the PN junction between the semiconductor layers 105 and 106 is not caused to be in a short circuit electrically even if the area 109 where metal is diffused from the electrode material 107 by annealing reaches the lower semiconductor layer 105 through the upper semiconductor layer 106. Hence making the maintenance of the diode characteristics possible.

Figure 39A:
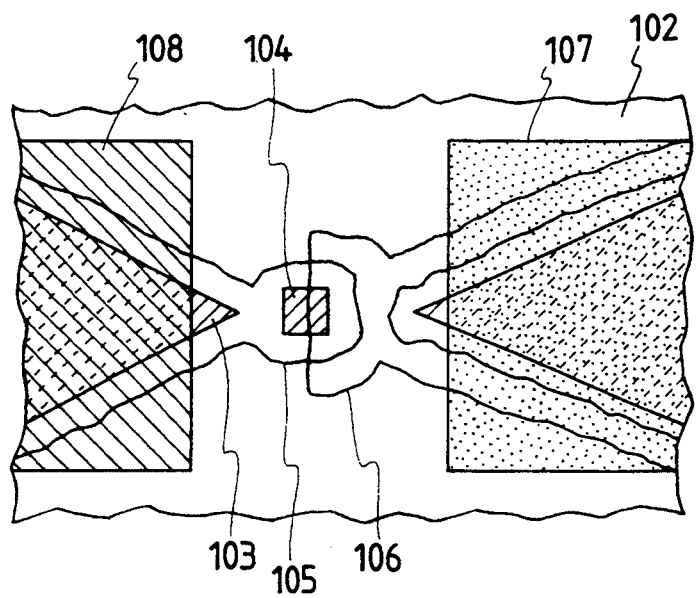
FIGS. 39A and 39B are schematic views showing an example of the arrangements of the nucleation surface and non-nucleation surface.
Figure 39B:
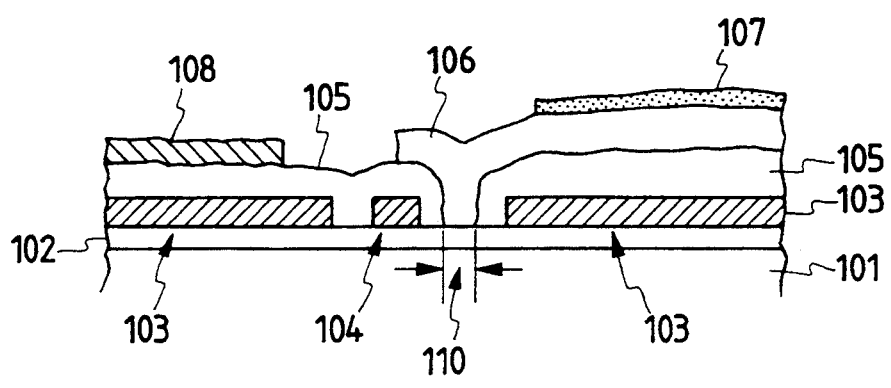
Figure 40A:
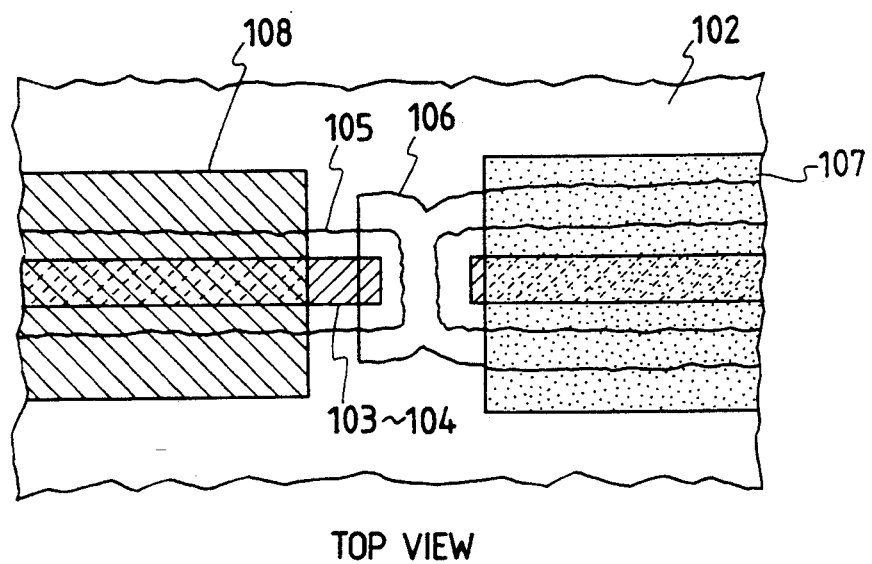
FIGS. 40A and 40B are schematic views showing an example of the arrangements of the nucleation surface and non-nucleation surface.
Figure 40B:
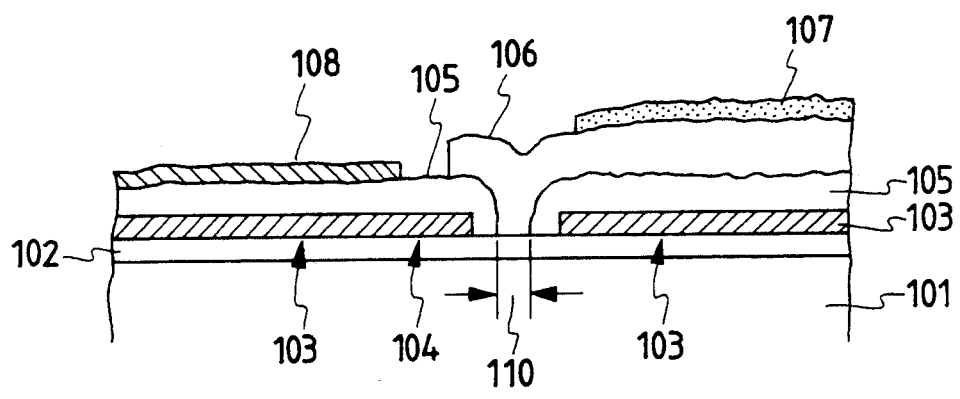

Also, the arrangement of the nucleation surface should only be made so that the nucleation surface 104 of the LED formation area is arranged to be asymmetrical to the nucleation surface 103 of the taking off areas for the p type and n type electrodes (displaced toward either one of the p type and n type taking off areas), and it is not limited to the structure shown in FIGS. 30A and 30B. For example, as shown in FIGS. 39A and 39B, the nucleation surface 103 of the electrode take off area can be of a circular shape or as shown in FIGS. 40A and 40B, the LED formation area 104 and the nucleation surface of one of one electrode taking off area 103 may be coupled to be of an integrated structure. The longer distance of those distances between the nucleation surface 104 of the LED formation area and the nucleation surface 103 of the electrode taking off area is generally 1 to 100 $\mu$m, preferably, 3 to 70 $\mu$m, or most preferably, 5 to 40 $\mu$m.

FIG. 33A to FIG. 38B are views schematically showing the outline of the processes for manufacturing LED elements using the GaAs polycrystals according to the present invention.

(A) On an almina substrate 301 of 1 mm thick, an SiO$_2$ film 302 is deposited for 1,500 Å by a CVD method using SiH$_4$ and O$_2$. This is the non-nucleation surface 303.

The deposition conditions at this time are: SiH$_4$ 45 sccm, O$_2$ 60 sccm, N$_2$ 50 sccm; substrate temperature, 440° C.; pressure, normal; and deposition time, 90 seconds.

Figure 33A:
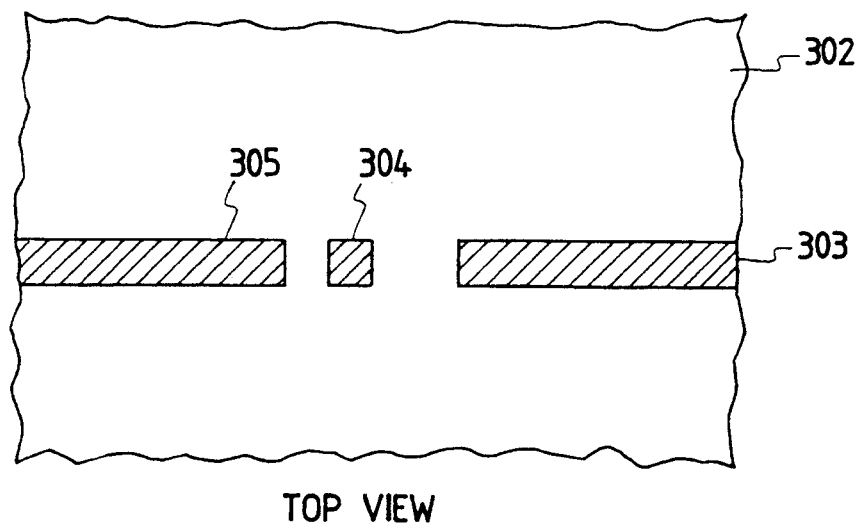
FIGS. 33A and 33B are schematic views showing the formation of the nucleation surface and non-nucleation surface.
Figure 33B:
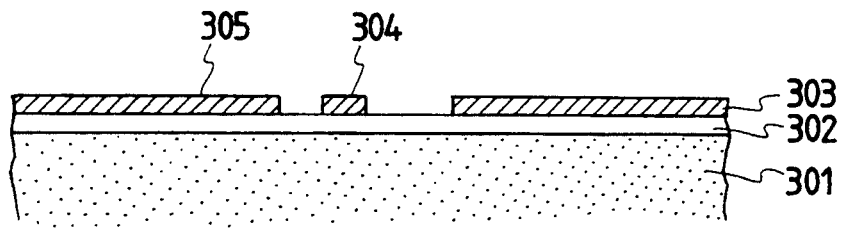

Subsequently, a polysilicon film is deposited for 500 Å by a PLCVD method, and by a photography technique, it is patterned into fine squares with 2 $\mu$m on every side to be the nucleation surface 304 of the LED area. Also, it is patterned into fine oblongs with 2 $\mu$m on every shorter side and 40 $\mu$m on every longer side to be the n type electrode taking off area 305 and p type electrode taking off area 303. The distance between the nucleation surfaces 304 and 305 is 10 $\mu$m while its distance to 303, 30 $\mu$m. The polysilicon deposition conditions at this time are: SiH$_4$ 45 sccm; substrate temperature, 620° C.; pressure, 220 mtorr; and deposition time; 5 minutes 30 seconds (FIGS. 33A and 33B).

(B) For the growth of GaAs, a MOCVD method is employed.

At first, the n type GaAs 306 is desposited on the nucleation surfaces 303 to 305.

The growth conditions at this time are given below.

| | |
|---|---|
| TMG | 2.4 × 10$^{-5}$ mol/min |
| AsH$_3$ | 1.8 × 10$^{-3}$ mol/min |
| SiH$_4$ (dopant) | 9.0 × 10$^{-6}$ mol/min |
| HCl (etching gas) | 1 × 10$^{-5}$ mol/min |
| H$_2$ (carrier gas) | 10 l/min |
| Substrate temperature | 775° C. |
| Pressure | 20 Torr |

Figure 34A:
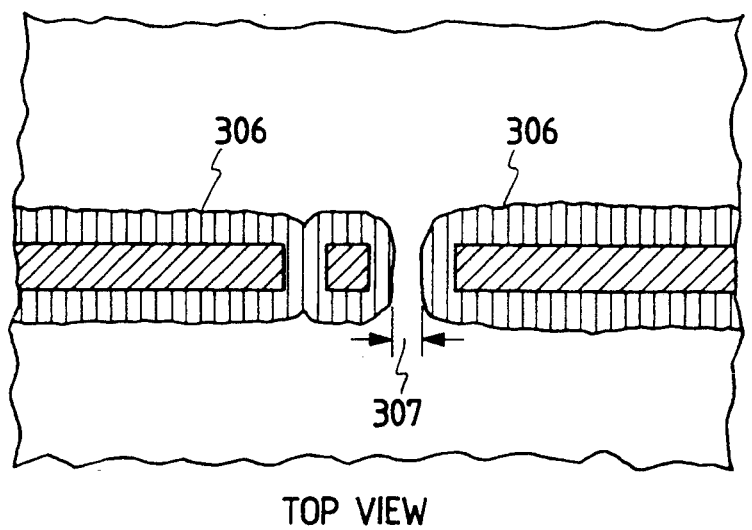
FIGS. 34A and 34B are schematic views showing the deposition of the n type GaAs polycrystalline layer.
Figure 34B:
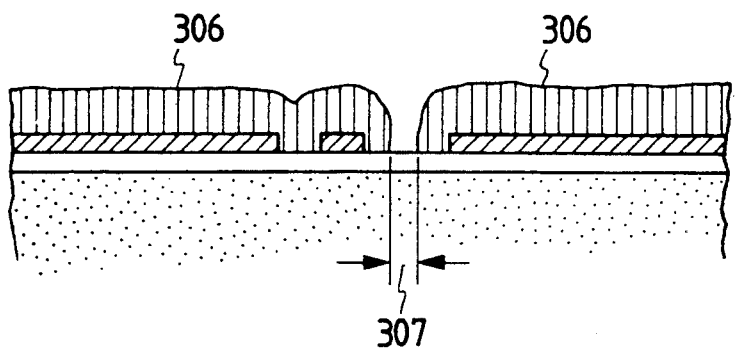

The growth is continued for 70 minutes to have grown the interval 307 between the GaAs crystalline islands to be 5 $\mu$m (FIGS. 34A and 34B).

Figure 35A:
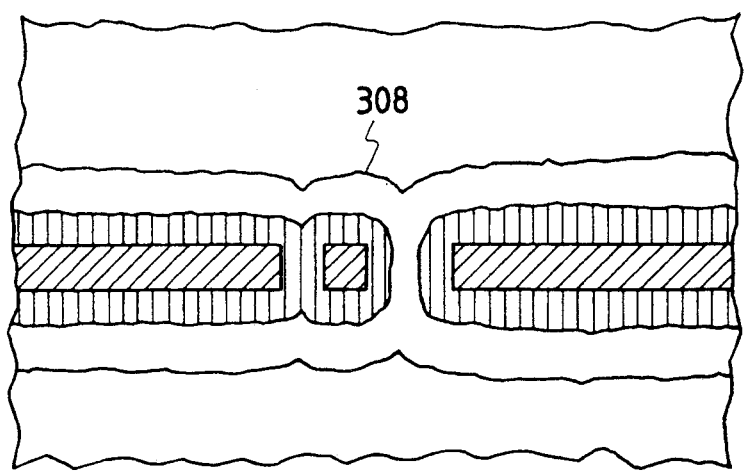
FIGS. 35A and 35B are schematic views showing the deposition of the p type GaAs polycrystalline layer.
Figure 35B:
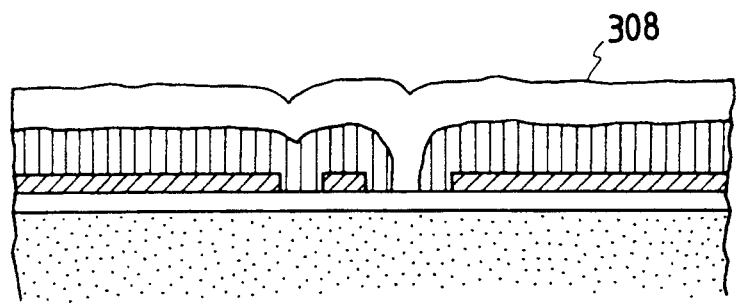

(C) Subsequently, the doping material is switched from SiH$_4$ to DEZ to grow the p type GaAs 308. The growth conditions are: instead of the SiH$_4$ which has been suspended, DEZ being flown for 1×10$^{-5}$ mol/min; all others, the same as (B). The growth is given for 30 minutes to bury the interval between the n type crystalline islands completely (FIGS. 35A and 35B).

Figure 36A:
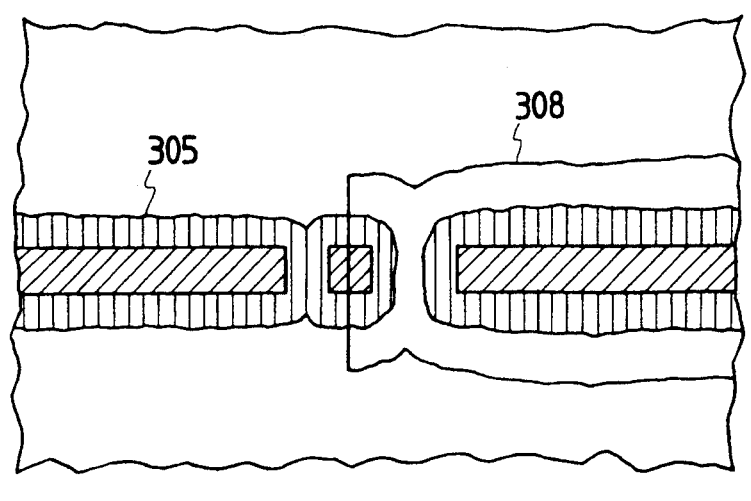
FIGS. 36A and 36B are schematic views showing the etching process for the p type GaAs polycrystalline layer.
Figure 36B:
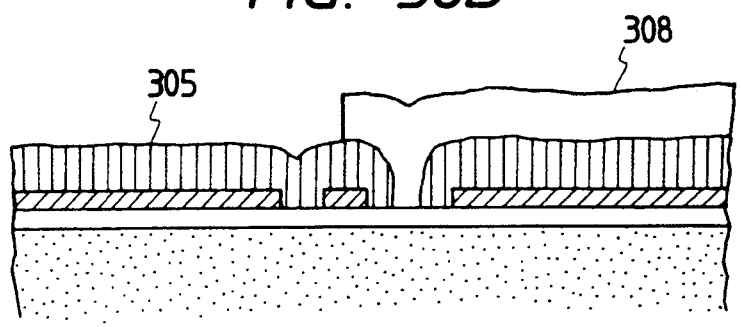

(D) After patterning with resist, the p type layer 308 is etched by immersing it in a mixed solution of CH$_3$COOH, H$_2$O$_2$, H$_2$SO$_4$, and H$_2$O for 15 second to cause the n type layer 305 to be exposed (FIGS. 36A and 36B).

Figure 37A:
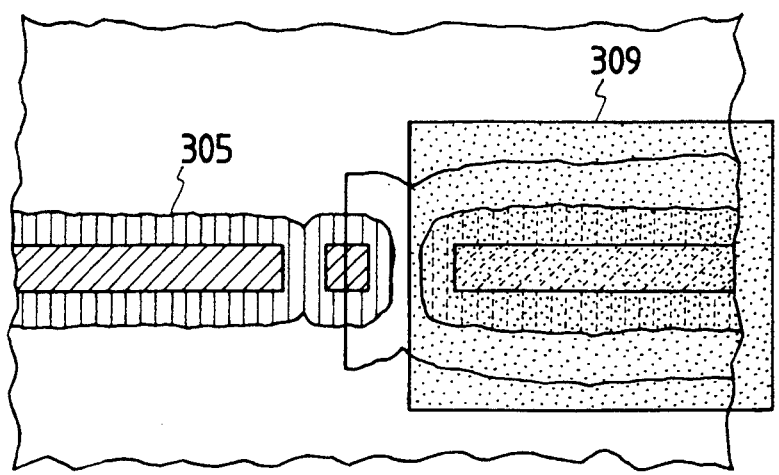
FIGS. 37A and 37B are schematic views showing the formation of the p type electrode.
Figure 37B:
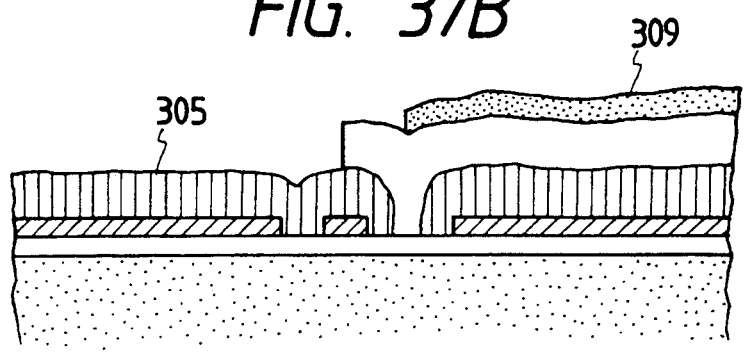

(E) On the area other than the area where the p type electrode is formed, a pattern is produced by resist. Then, Cr/Au film is deposited. The deposition method is a resistive thermal method and after the continuous deposition of Cr for 500 Å and Au for 5,000 Å, the p type electrode 309 is formed by a lift-off method (FIGS. 37A and 37B).

(F) On the area other than the area where the n type electrode is formed, a pattern is produced by resist. Then, AuGe/Au film is deposited. After AuGe alloy for 2,000 Å and Au for 5,000 Å are continuously deposited by a resistive thermal method the n type electrode 310 is formed by a lift-off method.

Figure 38A:
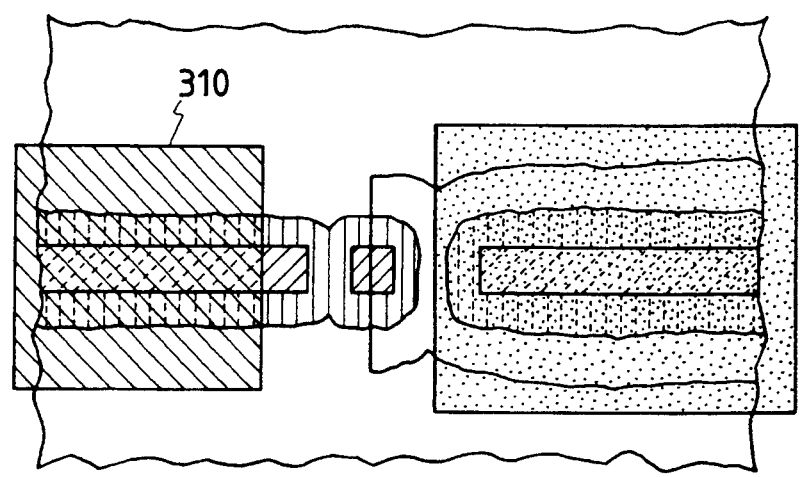
FIGS. 38A and 38B are schematic views showing the formation of the n type electrode.
Figure 38B:
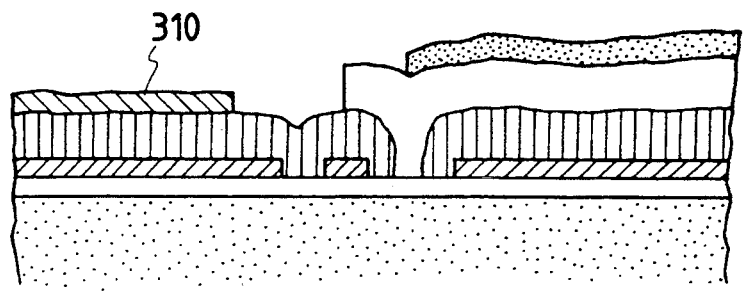

After the completion of the element formation, a thermal treatment is given in Ar atmosphere at a temperature of 420° C. for 10 minutes (FIGS. 38A and 38B).

Here, when the average grain size of the polycrystals which form the light emitting area on the nucleation surface 304 is measured, it indicates 0.6 $\mu$m or more while the average grain size of the GaAs formed on the nucleation surfaces 304 and 305 is 0.5 $\mu$m or less.

Figure 41A:
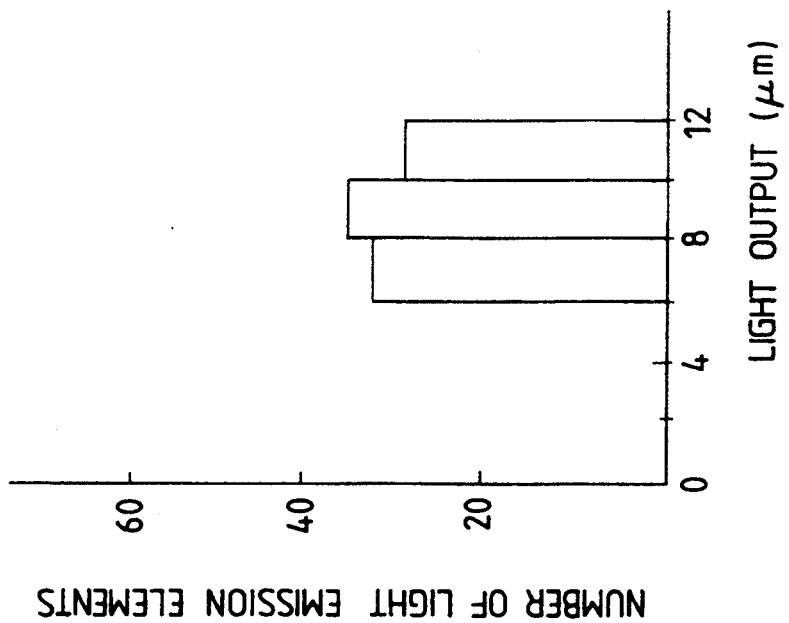
Figure 41A:
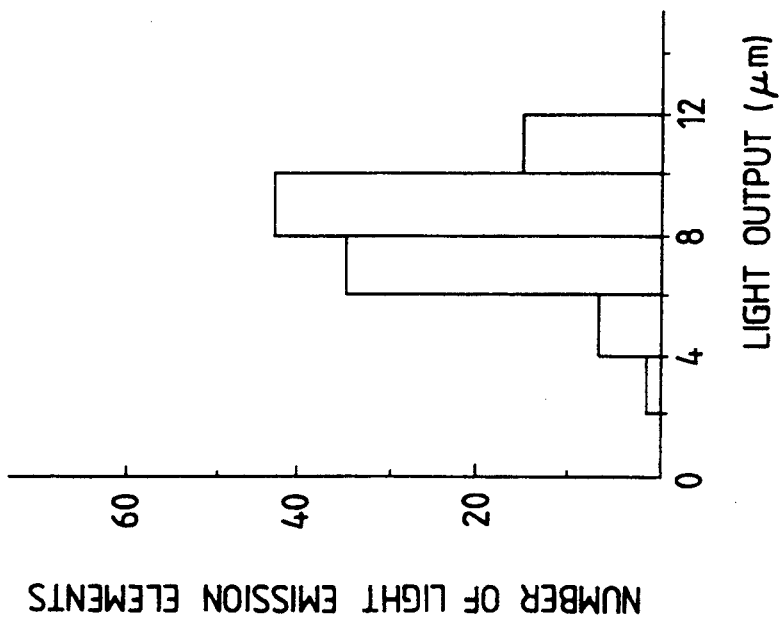

FIGS. 41A and 41B are graphs showings the results of the investigations of the light output fluctuations of the elements according to the prior art and the present invention. The light output at this time is represented as the one saturated with the increasing current. According to the light output fluctuations, the concentration is observed at 6 to 12 $\mu$w for the elements of the present invention whereas several percentages of the output which is as low as 6 $\mu$w or less are observed for those of the prior art.

Embodiment 5

FIGS. 42A to 47B are views schematically showing the outline of the processes for manufacturing light emission elements using the GaAsP polycrystals according to the present invention.

Figure 42A:
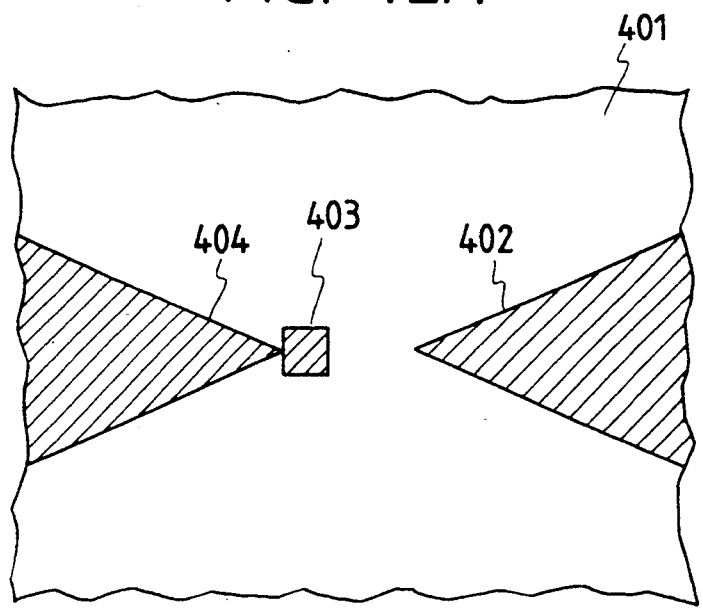
FIGS. 42A and 42B are schematic views showing the formation of a nucleation surface.
Figure 42B:
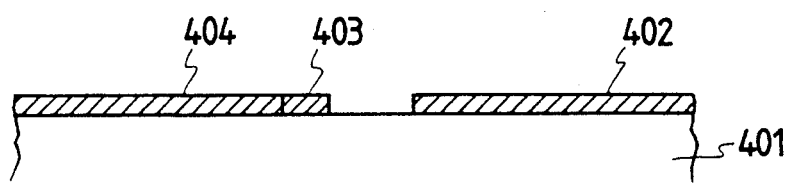

(A) On quartz substrate 401 of 1 mm thick (this being the non-nucleation surface as it is), a polysilicon film is deposited for 500 Å by an LPCVD method and is patterned into fine squares of 2 $\mu$m on every side by a photography technique to be the nucleations surface 403 of the LED area. Also, it is patterned into fine oblong with 40 $\mu$m of every shorter side and 80 $\mu$m of every longer side to be the nucleation surface 404 for the n type electrode taking off area and nucleation surface 402 for the p type electrode taking off area. The nucleation surfaces 403 and 402 are in contact, and its distance to 402 is 30 $\mu$m. The polysilicon deposition conditions at this time are: SiH$_4$ 45 sccm; substrate temperature, 620° C.; pressure, 220 mtorr; and deposition time; 5 minutes 30 seconds (FIGS. 42A and 42B).

(B) For the growth of GaAsP, a MOCVD method is employed.

At first, the n type GaAsP 405 is deposited on the nucleation surfaces 402 to 404.

The growth conditions at this time are given below.

| | |
|---|---|
| TMG | 2.4 × 10$^{-5}$ mol/min |
| AsH$_3$ | 1.0 × 10$^{-3}$ mol/min |
| TBP (tertial butyl phosphine) | 1.2 × 10$^{-3}$ mol/min |
| SiH$_4$ (dopant) | 9.0 × 10$^{-6}$ mol/min |
| HCl (etching gas) | 1 × 10$^{-5}$ mol/min |
| H$_2$ (carrier gas) | 10 l/min |
| Substrate temperature | 800° C. |

| | |
|---|---|
| -continued | |
| Pressure | 20 Torr |

Figure 43A:
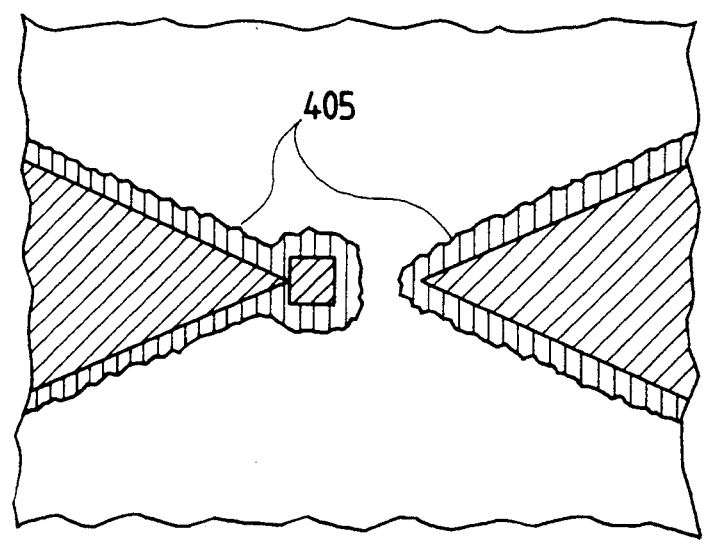
FIGS. 43A and 43B are schematic views showing the deposition of an n type GaAs polycrystalline layer.
Figure 43B:
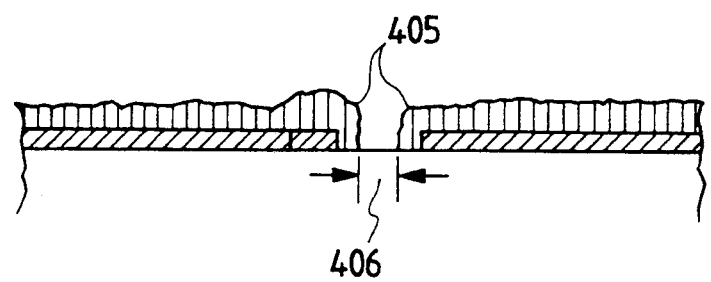

The growth is continued for 65 minutes to have grown the interval 406 between the GaAsP crystalline islands to be 5 μm (FIGS. 43A and 43B).

Figure 44A:
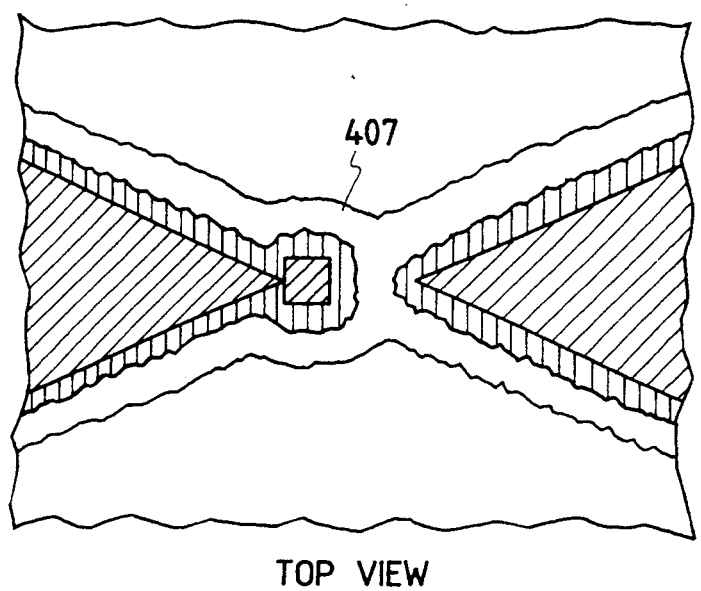
FIGS. 44A and 44B are schematic views showing the deposition of a p type GaAs polycrystalline layer.
Figure 44B:
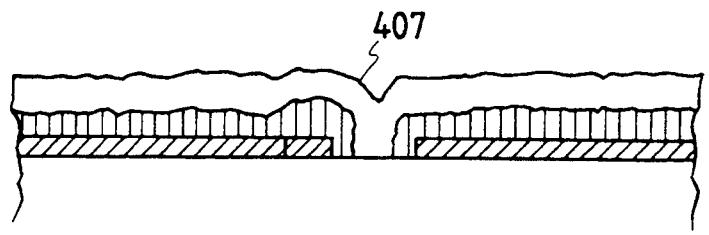

(C) Subsequently, the doping material is switched from $SiH_4$ to DZE to grow the p type GaAsP 407. The growth conditions are: instead of the SiH which has been suspended, DEZ being flown for $1\times 10^{-5}$ mol/min; all others, the same as (B). The growth is given for 35 minutes to bury the interval between the n type crystalline islands completely (FIGS. 44A and 44B).

Figure 45A:
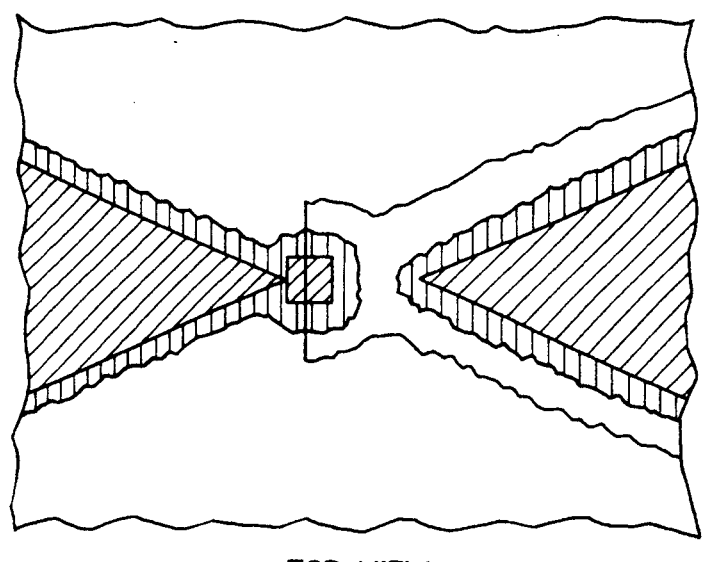
FIGS. 45A and 45B are schematic views showing the etching process for a p type GaAs polycrystalline layer.
Figure 45B:
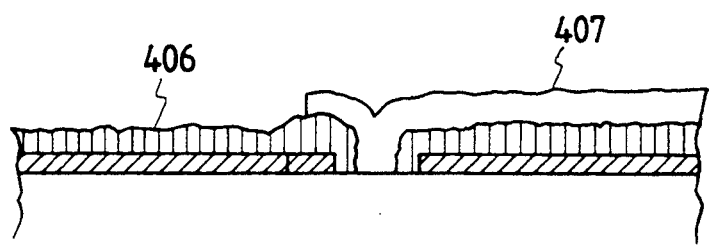

(D) After patterning with resist, the p type layer 407 is etched by immersing it in a mixed solution of $CH_3COOH$, $H_2O_2$, $H_2SO_4$, and $H_2O$ for 18 second to cause the n type layer 406 to be exposed (FIGS. 45A and 45B).

Figure 46A:
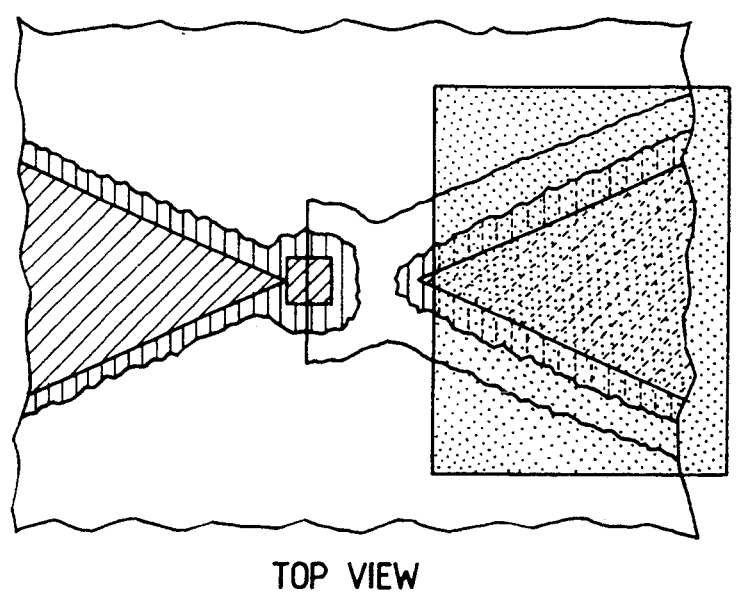
FIGS. 46A and 46B are schematic views showing the formation of a p type electrode.
Figure 46B:
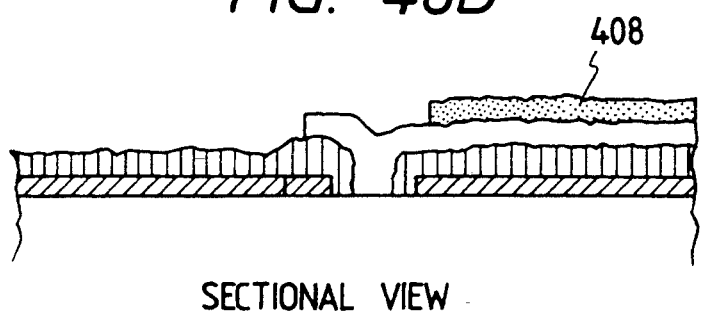

(E) On the area other than the area where the p type electrode is formed, a pattern is produced by resist. Then, Al film is deposited. The deposition method is a resistive thermal method and after 6,000 Å is deposited, the p type electrode 408 is formed by a lift-off method (FIGS. 46A and 46B).

(F) On the area other than the area where the n type electrode is formed, a pattern is produced by resist. Then, AuGe/Ni film is deposited. After AuGe alloy for 3,000 Å and Ni for 4,000 Å are continuously deposited by a resistive thermal method, the n type electrode 409 is formed by a lift-off method.

Figure 47A:
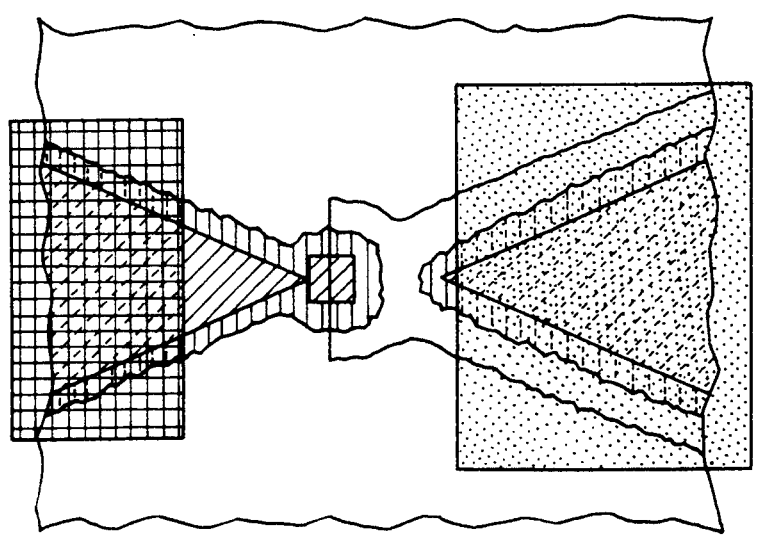
FIGS. 47A and 47B are schematic views showing the formation of an n type electrode.
Figure 47B:
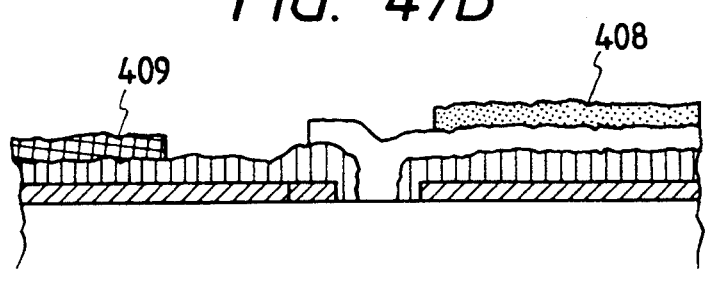

Subsequent to the completion of the element fabrication, a thermal treatment is given at 480° C. for 10 minutes in Ar atmosphere (FIGS. 47A and 47B).

Here, when the average grain size of the polycrystals which form the light emitting area on the nucleation surface 403 is measured, it indicates 0.6 μm or more while the average grain size of the GaAsP formed on the nucleation surfaces 402 and 404 is 0.5 μm or less.

Figure 48B:
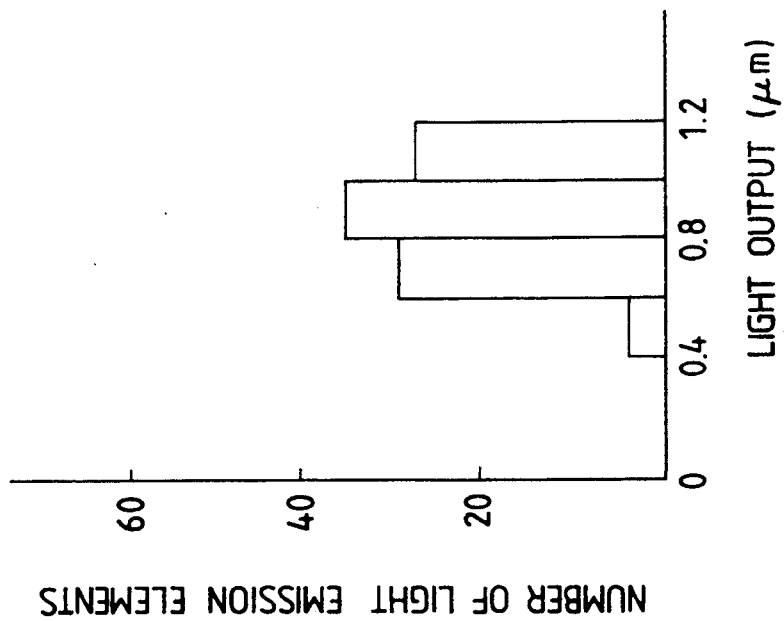
FIGS. 48A and 48B are graphs showing the distribution of the optical output of an LED according to an example of the prior art and the distribution of the optical output of an LED according to the present invention.
Figure 48A:
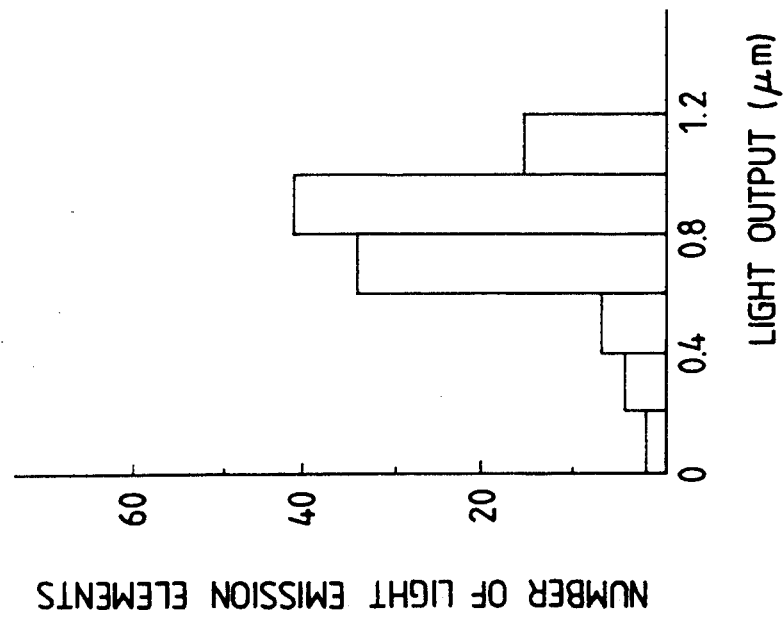
Figure 49A:
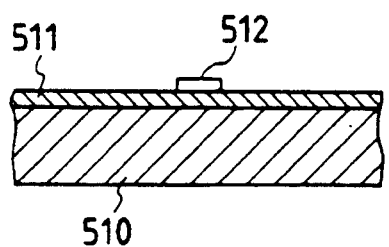
Figure 49D:
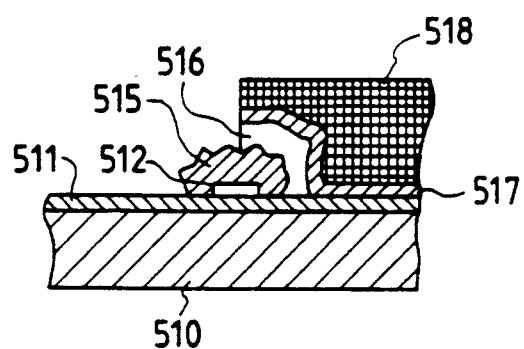
Figure 49B:
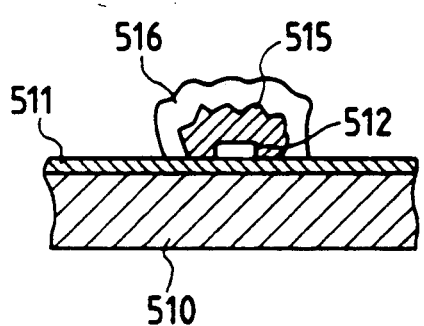
Figure 49E:
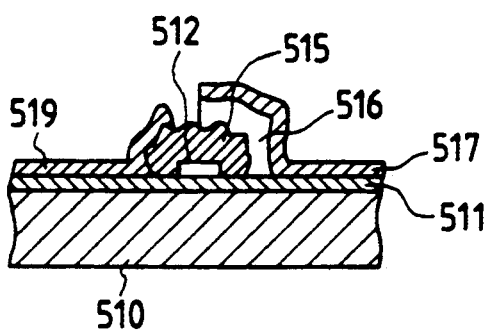
Figure 49C:
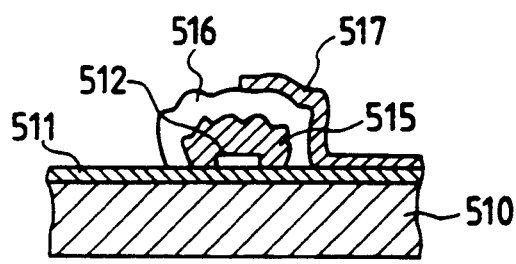

FIGS. 48A and 48B are graphs showing the results of the investigations of the light output fluctuations of the elements according to the prior art and the present invention. The light output at this time is represented as the one saturated with the increasing current. According to the light output fluctuations, the output concentration is observed at 0.6 to 1.2 μw for the elements of the present invention whereas approximately 10% of the low output of 0.6 μw or less are observed for those of the prior art.

What is claimed is:

1. A light emission element using a polycrystalline semiconductor material of III-V group compound including an n type semiconductor polycrystalline layer and a p type semiconductor polycrystalline layer, wherein said n type semiconductor polycrystalline layer and said p type semiconductor polycrystalline layer comprise a light emitting area formed by polycrystals, the average grain size of said polycrystals being at least 0.6 μm, and a wiring area formed by polycrystals wherein the average grain size of said polycrystals is 0.5 μm or less.

2. A light emission element structured by forming polycrystals of III-V group compound wherein a crystal growth treatment is applied to a substrate having a non-nucleation surface of a small nucleation density, a first nucleation surface of a nucleation density larger than that of said nonnucleation surface, over which a PN junction is placed to form a light emitting area, a second nucleation surface a first portion over which a p type semiconductor layer is formed and a second portion over which is formed an n type semiconductor layer, and first and second electrodes formed respectively over said first and second portions, wherein said first nucleation surface is arranged in a position so as to be closer to one of said first and second portions of said second nucleation surface, and the average grain size of the polycrystalline semiconductor constituting said light emitting area is at least 0.6 μm, and the average grain size of the p type semiconductor layer and n type semiconductor layer where said electrodes are formed is 0.5 μm or less.

* * * * *

UNITED STATES PATENT AND TRADEMARK OFFICE
CERTIFICATE OF CORRECTION

PATENT NO. : 5,369,290
DATED : November 29, 1994
INVENTOR(S) : HIDESHI KAWASAKI, ET AL.   Page 1 of 4

It is certified that error appears in the above-identified patent and that said Letters Patent is hereby corrected as shown below:

ON TITLE PAGE

In [56] References Cited, under FOREIGN PATENT DOCUMENTS:
"64723  1/1989  Japan" should read
--64-723  1/1989  Japan--.

In [57] ABSTRACT, Line 1:  "plycrystalline" should read
--polycrystalline--.

COLUMN 2

Line 33, "sputtering" should read --sputtering,--.
Line 35, "$Ta_2O_5$," should read --$Ta_2O_5$;--.

COLUMN 3

Line 16, "a" should be deleted.

COLUMN 8

Line 17, "Hence easier correc-" should read --Hence,--.
Line 18, "tion of" should be deleted.
Line 32, "such" should be deleted and "that" should be deleted.

COLUMN 11

Line 37, "lager" should read --larger--.

UNITED STATES PATENT AND TRADEMARK OFFICE
CERTIFICATE OF CORRECTION

PATENT NO. : 5,369,290
DATED : November 29, 1994
INVENTOR(S) : HIDESHI KAWASAKI, ET AL.

It is certified that error appears in the above-identified patent and that said Letters Patent is hereby corrected as shown below:

COLUMN 12

Line 3, "the" should be deleted.
Line 39, "10" should be deleted.
Line 46, "then" should read --and--.
Line 47, "and" should read --then--.

COLUMN 13

Line 7, "in other" should read --In other--.
Line 52, "a" should read --an--.

COLUMN 14

Line 2, "are" should read --is--.
Line 30, "(diethy" should read --(diethyl--.
Line 67, "1" should be deleted.

COLUMN 16

Line 26, "H$_2$ SO$_4$ and H$_2$ SO$_2$." should read --H$_2$SO$_4$ and H$_2$SO$_2$.--.

COLUMN 17

Line 19, "for" should read --to--.
Line 54, "durally" should be deleted.

COLUMN 18

Line 8, "1x10 Torr" should read --1x10$^{-6}$ Torr--.
Line 39, "Table 5." should be deleted.
Line 40, "Deposition Condtions" should be deleted.

UNITED STATES PATENT AND TRADEMARK OFFICE
CERTIFICATE OF CORRECTION

PATENT NO. : 5,369,290
DATED : November 29, 1994
INVENTOR(S) : HIDESHI KAWASAKI, ET AL.

It is certified that error appears in the above-identified patent and that said Letters Patent is hereby corrected as shown below:

COLUMN 18

TABLE 5, "DeZn" should read --DEZn--.
    Line 63, "a" should read --an--.

COLUMN 19

Line 14, "a ultrasonic" should read --an ultrasonic--.

COLUMN 20

Line 30, "a" should be deleted.
    Line 36, "(arrange" should read --(arranged--.
    Line 44, "are" should read --is--.
    Line 53, "5x10 mol %," should read --$5 \times 10^{-3}$ mol %,--.

COLUMN 21

Line 10, "of one of one" should read --of one--.
    Line 21, "almina" should read --alumina--.
    Line 68, "15 second" should read --15 seconds--.

COLUMN 22

Line 25, "showings" should read --showing--.
    Line 45, "nucleations" should read --nucleation--.
    Line 47, "oblong" should read --oblongs--.

COLUMN 23

Line 9, "DZE" should read --DEZ--.
    Line 17, "18 second" should read --18 seconds--.

UNITED STATES PATENT AND TRADEMARK OFFICE
CERTIFICATE OF CORRECTION

PATENT NO. : 5,369,290
DATED : November 29, 1994
INVENTOR(S) : HIDESHI KAWASAKI, ET AL.

It is certified that error appears in the above-identified patent and that said Letters Patent is hereby corrected as shown below:

<u>COLUMN 24</u>

Line 6, "are" should read --is--.
Line 26, "nonnucleation" should read --non-nucleation--.

Signed and Sealed this

Twenty-fifth Day of April, 1995

Attest:

BRUCE LEHMAN

*Attesting Officer*    *Commissioner of Patents and Trademarks*